(12) United States Patent
Yoshida et al.

(10) Patent No.: US 10,978,296 B2
(45) Date of Patent: Apr. 13, 2021

(54) NITRIDE SEMICONDUCTOR SUBSTRATE, SEMICONDUCTOR LAMINATE, LAMINATED STRUCTURE, METHOD FOR MANUFACTURING NITRIDE SEMICONDUCTOR SUBSTRATE AND METHOD FOR MANUFACTURING SEMICONDUCTOR LAMINATE

(71) Applicants: SCIOCS COMPANY LIMITED, Ibaraki (JP); SUMITOMO CHEMICAL COMPANY, LIMITED, Tokyo (JP)

(72) Inventors: Takehiro Yoshida, Ibaraki (JP); Hajime Fujikura, Ibaraki (JP); Masatomo Shibata, Ibaraki (JP); Fumimasa Horikiri, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 274 days.

(21) Appl. No.: 16/223,924

(22) Filed: Dec. 18, 2018

(65) Prior Publication Data
US 2019/0198312 A1 Jun. 27, 2019

(30) Foreign Application Priority Data

Dec. 25, 2017 (JP) .............................. JP2017-247639

(51) Int. Cl.
*H01L 21/02* (2006.01)
*H01L 29/32* (2006.01)
(Continued)

(52) U.S. Cl.
CPC .... *H01L 21/0254* (2013.01); *H01L 21/02005* (2013.01); *H01L 21/0262* (2013.01);
(Continued)

(58) Field of Classification Search
None
See application file for complete search history.

(56) References Cited

U.S. PATENT DOCUMENTS 6,413,627 B1 * 7/2002 Motoki ............... H01L 21/0254
428/332
6,617,182 B2 * 9/2003 Ishida ................... H01L 33/007
438/22

(Continued)

OTHER PUBLICATIONS

Van De Wall, Chris G., "Effects of impurities on the lattice parameters of GaN", Physical Review B 68, 165209, published Oct. 29, 2003, 68 165209-1-5, Palo Alto Research Center, California, USA.

*Primary Examiner* — David E Graybill
(74) *Attorney, Agent, or Firm* — Pearne & Gordon LLP

(57) ABSTRACT

To provide a technique of increasing a radius of curvature of (0001) plane, and narrowing an off-angle distribution, there is provided a nitride semiconductor substrate containing a group III nitride semiconductor crystal and having a main surface in which a nearest low index crystal plane is (0001) plane, wherein (0001) plane in one of a direction along <1-100> axis and a direction along <11-20> axis orthogonal to the <1-100> axis, is curved in a concave spherical shape with respect to the main surface, and a radius of curvature of the (0001) plane in one of the direction along the <1-100> axis and the direction along the <11-20> axis orthogonal to the <1-100> axis is different from a radius of curvature of at least a part of the (0001) plane in the other direction.

9 Claims, 17 Drawing Sheets

(51) Int. Cl.
*H01L 29/04* (2006.01)
*H01L 21/78* (2006.01)
*H01L 29/872* (2006.01)
*H01L 29/20* (2006.01)

(52) U.S. Cl.
CPC .. *H01L 21/02381* (2013.01); *H01L 21/02389* (2013.01); *H01L 21/02395* (2013.01); *H01L 21/02428* (2013.01); *H01L 21/02433* (2013.01); *H01L 21/02458* (2013.01); *H01L 21/02576* (2013.01); *H01L 21/02639* (2013.01); *H01L 21/78* (2013.01); *H01L 29/045* (2013.01); *H01L 29/32* (2013.01); *H01L 29/872* (2013.01); *H01L 29/2003* (2013.01)

(56) References Cited

U.S. PATENT DOCUMENTS

| | | | | |
|---|---|---|---|---|
| 7,411,273 B2* | 8/2008 | Matsumoto | ............ | C30B 33/00 257/618 |
| 7,524,691 B2* | 4/2009 | Kitaoka | .................. | C30B 9/00 257/90 |
| 7,755,103 B2* | 7/2010 | Ueno | .................. | H01L 29/0657 257/190 |
| 7,777,305 B2* | 8/2010 | Kuroda | ............... | H01L 29/7787 257/624 |
| 8,946,774 B2* | 2/2015 | Ueno | ...................... | H01L 29/34 257/190 |
| 9,209,021 B2* | 12/2015 | Okuno | ............. | H01L 21/02579 |
| 10,312,409 B2* | 6/2019 | Li | ........................ | H01L 21/0254 |
| 2002/0137249 A1* | 9/2002 | Ishida | ............... | H01L 21/02494 438/47 |
| 2004/0147096 A1* | 7/2004 | Kitaoka | ............ | H01L 21/02458 438/483 |
| 2007/0176199 A1* | 8/2007 | Shibata | .................. | C30B 29/403 257/103 |
| 2007/0284696 A1* | 12/2007 | Matsumoto | ........... | C30B 29/406 257/615 |
| 2008/0029783 A1* | 2/2008 | Ueno | ................... | H01L 29/0657 257/190 |
| 2008/0217625 A1* | 9/2008 | Kuroda | ............. | H01L 29/66462 257/76 |
| 2013/0292688 A1* | 11/2013 | Ueno | .................... | H01L 29/045 257/76 |
| 2014/0353804 A1* | 12/2014 | Okuno | ............. | H01L 21/02381 257/628 |
| 2018/0026155 A1* | 1/2018 | Li | .......................... | H01L 33/22 257/98 |
| 2019/0198312 A1* | 6/2019 | Yoshida | ............. | H01L 21/0254 |

* cited by examiner

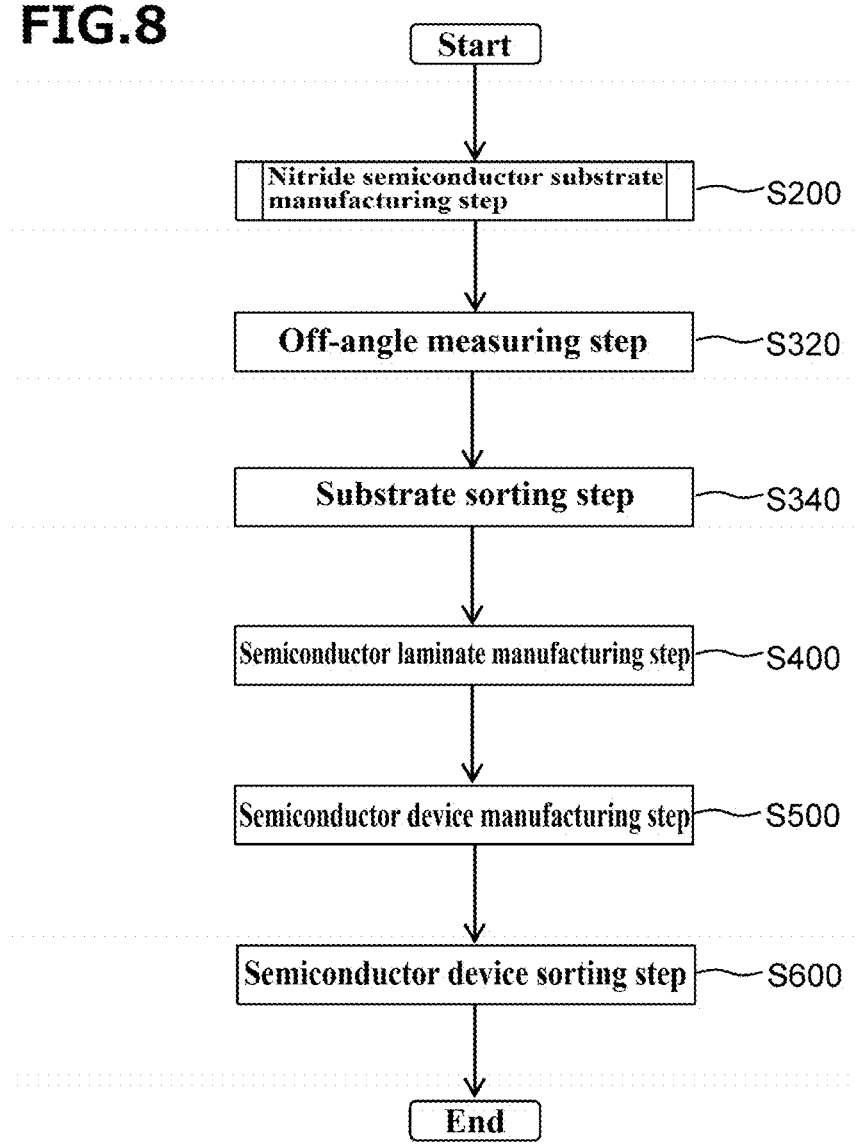

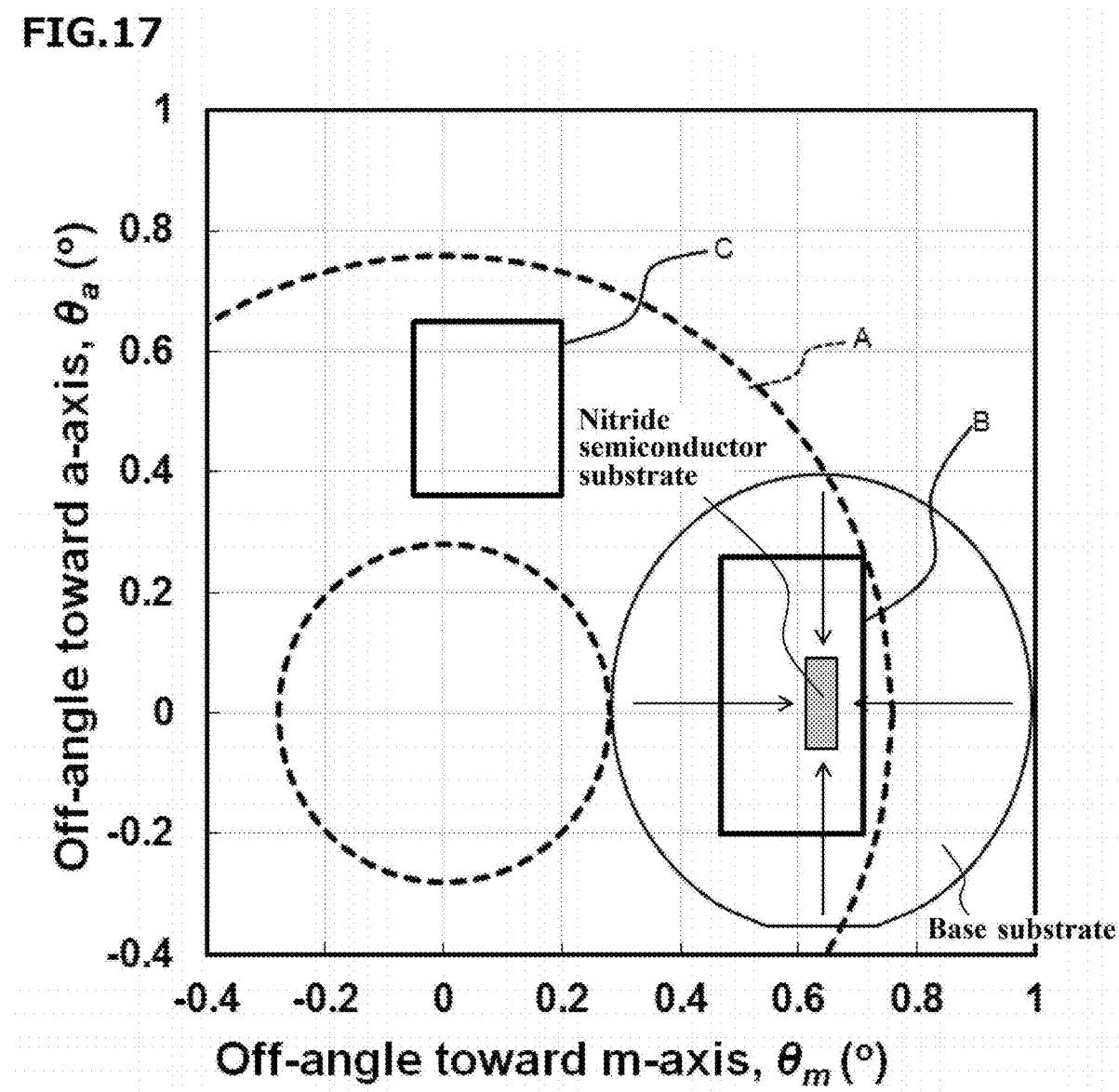

NITRIDE SEMICONDUCTOR SUBSTRATE, SEMICONDUCTOR LAMINATE, LAMINATED STRUCTURE, METHOD FOR MANUFACTURING NITRIDE SEMICONDUCTOR SUBSTRATE AND METHOD FOR MANUFACTURING SEMICONDUCTOR LAMINATE

TECHNICAL FIELD

The present invention relates to a nitride semiconductor substrate, a semiconductor laminate, a laminate structure, a method for manufacturing a nitride semiconductor substrate, and a method for manufacturing a semiconductor laminate.

DESCRIPTION OF RELATED ART

In a nitride semiconductor substrate containing a group III nitride semiconductor crystal such as gallium nitride (GaN), (0001) plane as a low index crystal plane nearest to a main surface of a substrate is sometimes curved in a concave spherical shape with respect to the main surface, due to a method for manufacturing the substrate (for example, see Patent Document 1).

PRIOR ART DOCUMENT

Patent Document

[Patent Document 1] Japanese Unexamined Patent Publication No.

SUMMARY OF THE INVENTION

Problem to be Solved by the Invention

In the nitride semiconductor substrate, when (0001) plane is curved in a concave spherical shape with respect to the main surface as described above, an off-angle, which is the angle formed by the <0001> axis with respect to a normal of the main surface, has a predetermined distribution within the main surface.

The off-angle of the substrate affects, for example, a surface morphology of a semiconductor functional layer grown on the substrate. For example, in the case that a radius of curvature of the (0001) plane of the substrate is small and the off-angle distribution of the substrate is wide (large variation), there is a possibility that the surface morphology of a part of the semiconductor functional layer is deteriorated due to the off-angle of a part of the substrate. Therefore, for example, when a semiconductor device or the like as a Schottky barrier diode (SBD) is manufactured using the above substrate, there is a possibility that a withstand voltage is lowered in a semiconductor device cut out from a portion where the surface morphology of the semiconductor functional layer is deteriorated.

Further, for example, when a light emitting layer is formed by doping indium (In) on the substrate, the off-angle of the substrate affects In content in the light emitting layer. For example, in the case that the radius of curvature of the (0001) plane of the substrate is small and the off-angle distribution of the substrate is wide, the In content in the light emitting layer is sometimes varied depending on the off-angle distribution of the substrate. Therefore, there is a possibility that variation in light emission wavelength and uneven light emission occur in a light emitting device having the light emitting layer.

Accordingly, a technique capable of increasing the radius of curvature of the (0001) plane and narrowing the off-angle distribution is desired, so that practical problems such as deterioration of surface morphology and uneven light emission are not generated.

An object of the present invention is to provide a technique capable of increasing the radius of curvature of the (0001) plane and narrowing the off-angle distribution.

Means for Solving the Problem

According to an aspect of the present invention, there is provided a nitride semiconductor substrate and a related technique, which is a nitride semiconductor substrate containing a group III nitride semiconductor crystal and having a main surface in which a nearest low index crystal plane is (0001) plane, wherein the (0001) plane in one of a direction along <1-100> axis and a direction along <11-20> axis orthogonal to the <1-100> axis, is curved in a concave spherical shape with respect to the main surface, and a radius of curvature of the (0001) plane in one of the direction along the <1-100> axis and the direction along the <11-20> axis orthogonal to the <1-100> axis is different from the radius of curvature of at least a part of the (0001) plane in the other direction.

Advantage of the Invention

According to the present invention, it is possible to increase the radius of curvature of the (0001) plane and narrow the off-angle distribution.

BRIEF DESCRIPTION OF THE DRAWINGS

FIG. 8 is a flowchart showing a method for manufacturing a semiconductor device according to an embodiment of the present invention.

FIG. 17 is an off-angle coordinate map showing a relationship between an off-angle distribution of the base substrate, an off-angle distribution of the nitride semiconductor substrate according to the example, and region A, region B, and region C.

DETAILED DESCRIPTION OF THE INVENTION

An Embodiment of the Present Invention

Hereinafter, an embodiment of the present invention will be described with reference to the drawings.

(1) Nitride Semiconductor Substrate (Nitride Semiconductor Free-Standing Substrate, Nitride Crystal Substrate)

Figure 1:
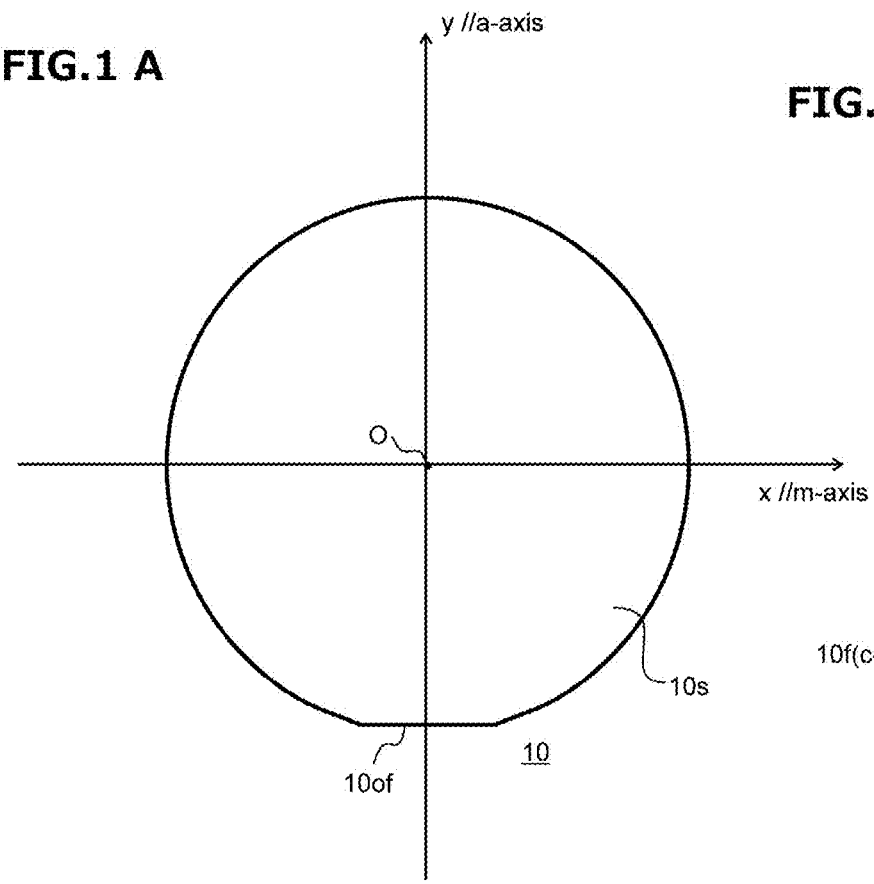
FIG. 1A is a schematic top view showing a nitride semiconductor substrate according to an embodiment of the present invention.
FIG. 1B is a schematic cross-sectional view along m-axis of the nitride semiconductor substrate according to an embodiment of the present invention.
FIG. 1C is a schematic cross-sectional view along a-axis of the nitride semiconductor substrate according to an embodiment of the present invention.
Figure 1:
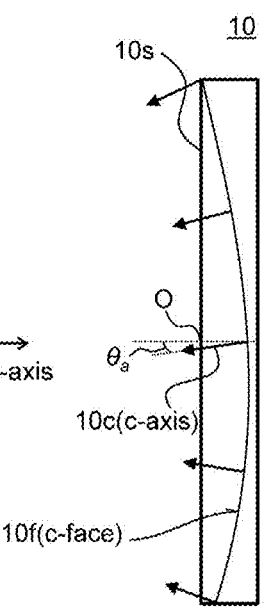
Figure 1:
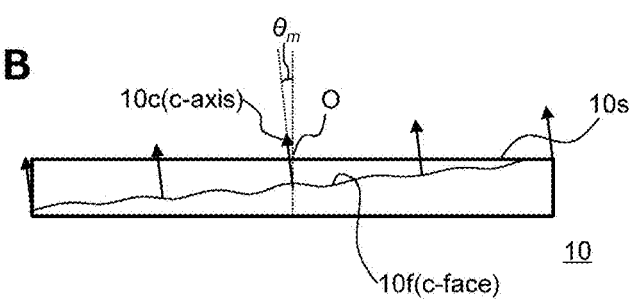

First, a nitride semiconductor substrate 10 (it may be abbreviated as "a substrate 10" hereafter) according to this embodiment will be described, with reference to FIG. 1. FIG. 1A is a schematic top view showing a nitride semiconductor substrate according to this embodiment, FIG. 1B is a schematic cross-sectional view along m-axis of the nitride semiconductor substrate according to this embodiment, and FIG. 1C is a schematic cross-sectional view along a-axis of the nitride semiconductor substrate according to this embodiment. The cross section along the m-axis and the cross section along the a-axis are cross sections passing through a center of the main surface of the substrate, respectively.

The substrate 10 of this embodiment is, for example, a free-standing substrate containing a group III nitride semiconductor crystal (single crystal). In this embodiment, the substrate 10 is, for example, a GaN freestanding substrate.

A diameter of the substrate 10 is, for example, 1 inch or more, and a thickness of the substrate 10 is, for example, 300 µm or more and 1 mm or less. Conductivity of the substrate 10 is not particularly limited. However, in the case of manufacturing a semiconductor device as a vertical Schottky barrier diode (SBD) using the substrate 10, the substrate 10 is, for example, n-type, n-type impurity in the substrate 10 is, for example, silicon (Si) or germanium (Ge), and the n-type impurity concentration in the substrate 10 is, for example, $1.0 \times 10^{18}$ cm$^{-3}$ or more and $1.0 \times 10^{20}$ cm$^{-3}$ or less.

Hereinafter, in a group III nitride semiconductor crystal having a wurtzite structure, <0001> axis (for example, [0001] axis) is referred to as "c-axis", (0001) plane is referred to as "c-face". The (0001) plane is sometimes referred to as "+c-face (group III element polar face)", and (000-1) plane is sometimes referred to as "−c-face (nitrogen (N) polar face)". Further, <1-100> axis (for example, [1-100] axis) is referred to as "m-axis", and (1-100) plane is referred to as "m-face". The m-axis may be expressed as <10-10> axis. Further, <11-20> axis (for example, the [11-20] axis) is referred to as "a-axis", and (11-20) plane is referred to as "a-face".

The substrate 10 has, for example, a main surface (surface) 10s which is an epitaxial growth surface. In this embodiment, a low index crystal plane nearest to the main surface 10s is, for example, a c-face 10f (+c-face).

The main surface 10s of the substrate 10 is, for example, mirror-finished, and surface roughness (arithmetic average roughness Ra) of the main surface 10s of the substrate 10 is, for example, 10 nm or less, preferably 5 nm or less.

Further, the substrate 10 has, for example, an orientation flat is abbreviated as "Ori-fla 10of" hereinafter) as a flat surface constituting a part of a side surface (not shown) connected to the main surface 10s and a back surface (not shown). In this embodiment, the Ori-fla 10of is, for example, a-face. The Ori-fla 10of may be other than the a-face as long as it is perpendicular to the c-face.

Hereinafter, a direction parallel to the Ori-fla 10of among the directions along the main surface 10s of the substrate 10 is defined as "x direction", and the coordinate in the direction parallel to the Ori-fla 10of at a position in the main surface 10s of the substrate 10 is defined as "x". Meanwhile, a direction perpendicular to the Ori-fla 10of among the directions along the main surface 10s of the substrate 10 is defined as "y direction", and the coordinate in the direction perpendicular to the Ori-fla 10of at a position in the main surface 10s of the substrate 10 is defined as "y". The coordinate (x, y) of the center of the main surface 10s of the substrate 10 is (0, 0). In this embodiment, for example, the Ori-fla 10of is the a-face, and therefore the x direction is the direction along the m-axis (substantially m-axis direction), and the y direction is the direction along the a-axis (substantially a-axis direction).

(Radius of Curvature of c-Face, and Off-Angle)

In this embodiment, the c-face 10f as the low index crystal plane nearest to the main surface 10s of the substrate 10, has for example, anisotropy due to a method for manufacturing the substrate 10 described later.

The c-face 10f of the substrate 10 in one of the direction along the m-axis and the direction along the a-axis orthogonal to the m-axis, is for example, curved in a concave spherical shape with respect to the main surface 10s. The "spherical shape" as used herein means a curved surface shape which is approximated to a spherical surface. Further, the "spherical approximation" here means that it is approximated to a true spherical surface or an elliptical spherical surface within a predetermined error range.

In this embodiment, as shown in FIG. 1C, the c-face 10f of the substrate 10 in the direction along the a-axis is, for example, curved in a concave spherical shape with respect to the main surface 10s.

Meanwhile, the c-face 10f in the other direction of the direction along the m-axis and the direction along the a-axis orthogonal to the m-axis, for example has a plurality of inflection points in the other direction, and has convex portions (not numbered) and concave portions (not numbered) alternately arranged in the other direction. The convex portion of the c-face 10f in the other direction are convexly curved with respect to the main surface 10s, and the concave portion of the c-face 10f in the other direction are concavely curved with respect to the main surface 10s. That is, the c-face 10f in the other direction meanders, for example, at a predetermined period. The period of the c-face 10f in the other direction may be constant or random.

The convex portions or the concave portions of the c-face 10f in the other direction, for example, may be convexly curved or concavely curved, with a spherically approximated curved surface as a reference. The curved surface serving as a reference of the c-face 10f in the other direction may be a concave spherical shape with respect to the main surface 10s, or may be a convex spherical shape with respect to the main surface 10s.

In this embodiment, as shown in FIG. 1B, the c-face 10f of the substrate 10 in the direction along the m-axis has, for example, convex portions and concave portions alternately arranged in the direction along the m-axis.

In this embodiment, the c-face 10f of the substrate 10 has the above shape, and therefore at least a part of the c-axes 10c is inclined with respect to the normal of the main surface 10s. The "off-angle" which is the angle formed by the c-axis 10c with respect to the normal of the main surface 10s has a predetermined distribution within the main surface 10s.

Hereinafter, in the off-angle of the c-axis 10c with respect to the normal of the main surface 10s, a directional component along the m-axis is defined as "$\theta_m$" and is sometimes abbreviated as "off-angle m-axis component $\theta_m$". Further, in the off-angle of the c-axis 10c with respect to the normal of the main surface 10s, a directional component along the a-axis is defined as "$\theta_a$" and is sometimes abbreviated as "off-angle a-axis component $\theta_a$". When the c-axis 10c is inclined, the m-axis and the a-axis are also inclined. Therefore the directional component along the m-axis and the directional component along the a-axis, can be strictly called in other words as the directional component obtained by orthogonally projecting the m-axis onto the main surface 10s and the directional component obtained by orthogonally projecting the a-axis on the main surface 10s. Further, in the following description, the off-angle is represented as ($\theta_m$, $\theta_a$) as a vector and a size of the off-angle (off amount) is represented as "$\theta$". It should be noted that $\theta^2 = \theta_m^2 + \theta_a^2$.

Further, in this embodiment, the radius of curvature of the c-face 10f in one of the direction along the m-axis and the direction along the a-axis orthogonal to the m-axis, is different from the radius of curvature of at least a part of the c-face 10f in the other direction. As described above, the c-face 10f in the other direction has periodicity, and therefore the radius of curvature of the c-face 10f in one direction may be different from the radius of curvature of at least a part of the c-face 10f in the other direction, and the other portion of the c-face 10f in the other direction may have a portion which coincides with the radius of curvature of the c-face 10f. Meanwhile, the radius of curvature of the c-face 10f in one direction may be different from the radius of curvature of the whole c-face 10f in the other direction.

In this embodiment, the radius of curvature of at least a part of the c-face 10f in the direction along the m-axis, for example, is larger than the radius of curvature of the c-face 10f in the direction along the a-axis orthogonal to the m-axis. The radius of curvature of at least a part of the c-face 10f in the direction along the m-axis, is for example 1.5 times or more, preferably 2 times or more the radius of curvature of the c-face 10f along the a-axis. The radius of curvature of at least a part of the c-face 10f in the direction along the m-axis may be larger than the radius of curvature of the c-face 10f in the direction along the a-axis, and the radius of curvature of the other part of the c-face 10f in the direction along the m axis may be equal to or less than the radius of curvature of the c-face 10f in the direction along the a-axis.

Further, the radius of curvature of the c-face 10f of the substrate 10 is, for example, larger than the base substrate 7 used in the method for manufacturing the substrate 10 described later. Specifically, the radius of curvature of the c-face 7f in the base substrate 7 is, for example, 1 m or more and less than 10 m. In contrast, the radius of curvature of the c-face 10f of the substrate 10 is, for example, 10 m or more. In other words, a minimum value of the radius of curvature of the c-face 10f in the direction along the m-axis and the direction along the a-axis is, for example, 10 m or more, preferably 20 m or more. An upper limit value of the radius of curvature of the c-face 10f of the substrate 10 is preferably as large as possible, and therefore it is not particularly limited. When the c-face 10f of the substrate 10 is flat, it can be considered that the radius of curvature of the c-face 10f is infinite.

Since the radius of curvature of the c-face 10f of the substrate 10 is large, the off-angle distribution of the c-axis 10c with respect to the normal of the main surface 10s of the substrate 10 can be narrowed. Specifically, when the diameter of the substrate 10 is D (mm), a maximum minimum difference AO (of a size) of the off-angle of the c-axis 10c with respect to the normal of the main surface 10s of the substrate 10 can be within, for example, D/500°, in the main surface 10s of the substrate 10.

Figure 2:
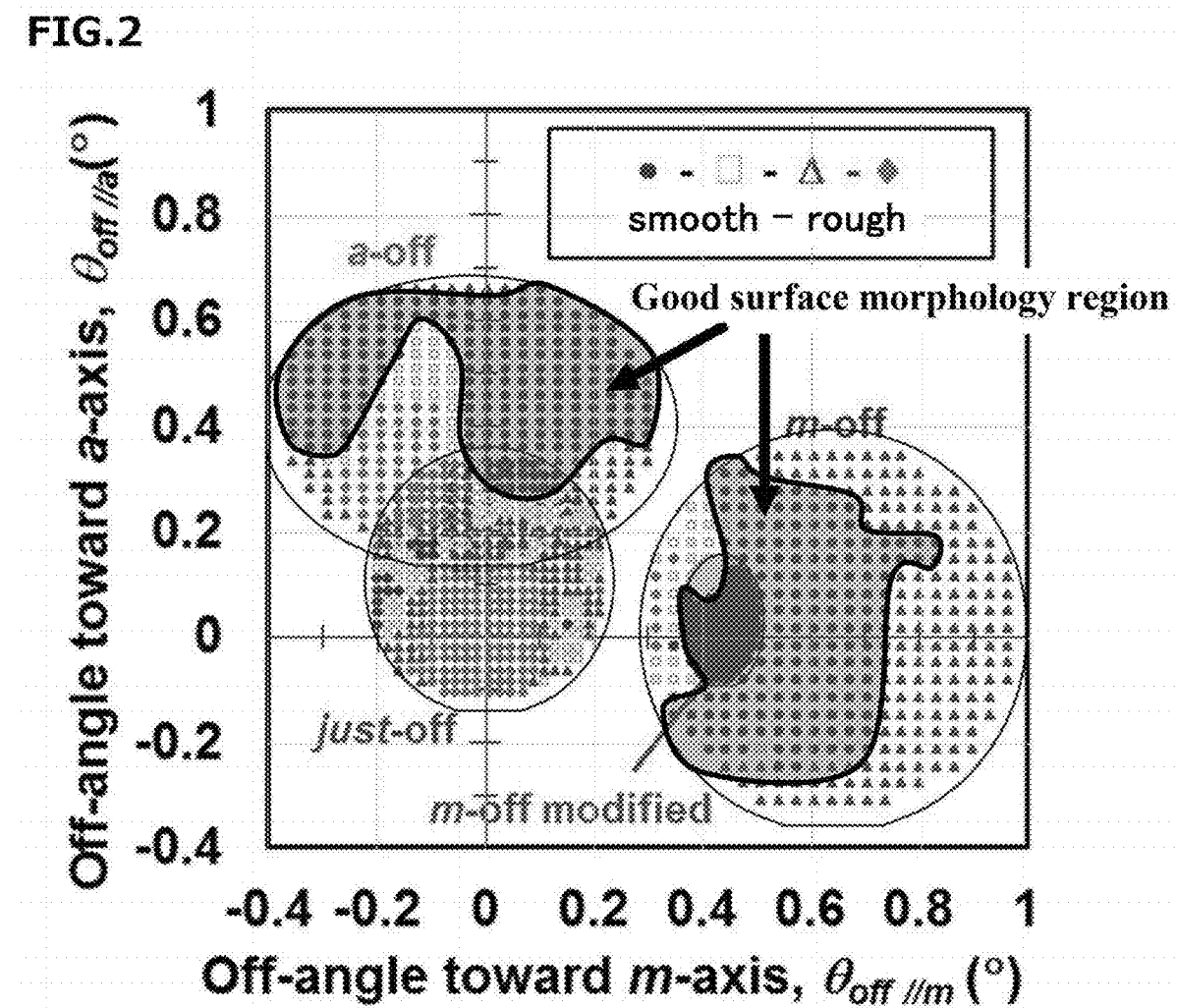
FIG. 2 is an off-angle coordinate map showing a good surface morphology region.

Here, the dependence of the surface morphology of the semiconductor functional layer on the off-angle of the main surface 10s of the substrate 10 will be described with reference to FIG. 2. FIG. 2 is an off-angle coordinate map showing a good surface morphology region. In the off-angle coordinate map of FIG. 2, off-angle m-axis component $\theta_m$ and off-angle a-axis component $\theta_a$ are used as coordinate axes, respectively.

In order to evaluate the dependence of the surface morphology of the semiconductor functional layer on the off-angle of the main surface of the substrate, a semiconductor laminate (epitaxial wafer) constituting SBD is fabricated. The semiconductor laminate has a laminate structure including a substrate and a semiconductor functional layer. The substrate is an n-type GaN freestanding substrate having a diameter of 2 inches and a thickness of 400 μm. Further, a base n-type semiconductor layer and a drift layer are sequentially formed as semiconductor functional layers. The base n-type semiconductor layer is a Si-doped GaN layer, Si concentration in the base n-type semiconductor layer is $2 \times 10^{18}$ cm$^{-3}$, and the thickness of the base n-type semiconductor layer is 2 µm. Further, the drift layer is a Si-doped GaN layer, Si concentration in the drift layer is $0.9 \times 10^{16}$ cm$^{-3}$, and the thickness of the base n-type semiconductor layer is 2 µm. Further, the drift layer is a Si-doped GaN layer, Si concentration in the drift layer is $0.9 \times 10^{16}$ cm$^{-3}$, and the thickness of the drift layer is 13 µm.

In the off-angle coordinate map of FIG. 2, the off-angle distribution is shown for each of the four substrates used for manufacturing the semiconductor laminate. The four substrates have mutually different off-angle distributions. Among the four substrates, a substrate whose off-angle at the center of the main surface is close to (0, 0) is defined as a "just-off substrate". Further, a substrate whose off-angle at the center of the main surface is away from (0, 0) and close to the $\theta_m$-axis is defined as "m-off substrate" or "m-off improved substrate". The off-angle distribution of the m-off improved substrate is narrower than the off-angle distribution of the m-off substrate. Further, a substrate whose off-angle at the center of the main surface is away from (0, 0) and close to the $\theta_a$-axis is defined as "a-off substrate". The Ori-fla of each of the four substrates is the a-face.

Further, the off-angle coordinate map of FIG. 2 shows a result of visually evaluating the surface morphology of the semiconductor functional layer every 2.25 mm square in a semiconductor laminate in which each of four substrates is used, and shows that the surface morphology of the semiconductor functional layer is good in an order of black diamonds, open triangles, open squares, and black circles.

As a trend of the above observation result, stripe-shaped step bunching in the direction along the m-axis is observed, on the whole surface of 2.25 square field of view in the portion of the black diamonds. This is remarkably observed when the off-angle ($\theta_m$, $\theta_a$) of the just-off substrate is close to (0, 0) as described later. Further, in the portion of the open triangles and the portion of the open squares, in this order, the proportion of the step bunching in the 2.25 mm square field of view is gradually decreased. Further, in the portion of the black circles, it is a flat surface on almost the whole surface of the 2.25 mm square field of view.

By measuring atomic force microscope (AFM), it is found that the portion of the black diamonds corresponds to a surface roughness (arithmetic average roughness Ra) of 70 nm or more, and the portion of the open triangles corresponds to the surface roughness of 30 nm or more and 70 nm or less, and the portion of the open squares corresponds to a surface roughness of 10 nm or more and 30 nm or less, and the portion of the black circles corresponds to a surface roughness of 10 nm or less. It is also confirmed that the result of the surface morphology distribution which is similar to the visual evaluation result by the Nomarski microscope, is obtained by the surface morphology measurement by measuring a scattered light distribution when laser light is irradiated on the surface of the semiconductor layer.

As shown in FIG. 2, the surface morphology of the semiconductor functional layer depends on the off-angle of the main surface of the substrate. When the off-angle ($\theta_m$, $\theta_a$) is close to (0, 0), the surface morphology of the semiconductor functional layer tends to be rough. In the case that the semiconductor device as an SBD is fabricated from a portion where the off-angle ($\theta_m$, $\theta_a$) is (0, 0) in the main surface of the substrate, there is a possibility that a withstand voltage of the SBD is lowered. In contrast, in a region (a region surrounded by a thick line) where the off-angle ($\theta_m$, $\theta_a$) is separated from (0, 0) by a predetermined distance, the surface morphology of the semiconductor functional layer is good. Hereinafter, in the off-angle coordinate map, a region where the surface morphology of the semiconductor functional layer is good is called "a good surface morphology region". Since the semiconductor device as an SBD is fabricated from the portion where the off-angle ($\theta_m$, $\theta_a$) is within a good surface morphology region in the main surface of the substrate, the withstand voltage of the SBD can be improved.

Further, as shown in FIG. 2, it is possible to easily grasp the surface morphology distribution of the semiconductor functional layer in a range of the main surface of the substrate, so as to correspond to the dependence of the surface morphology of the semiconductor functional layer, on the off-angle of the main surface of the substrate. For example, it is found that on the just-off substrate, a good surface morphology region can be obtained only in a part near an outer edge of the range of the main surface. That is, in the case that the semiconductor device is manufactured using the just-off substrate, it is expected that the yield of the semiconductor device will be lowered. Meanwhile, for example, in the m-off improved substrate, it is found that the range of the main surface in the off-angle coordinate map, that is, the off-angle distribution is narrow, and most of the range is included in the good surface morphology region. That is, in the case of manufacturing the semiconductor device using the m-off improved substrate, it is possible to improve the yield of the semiconductor device.

Figure 3:
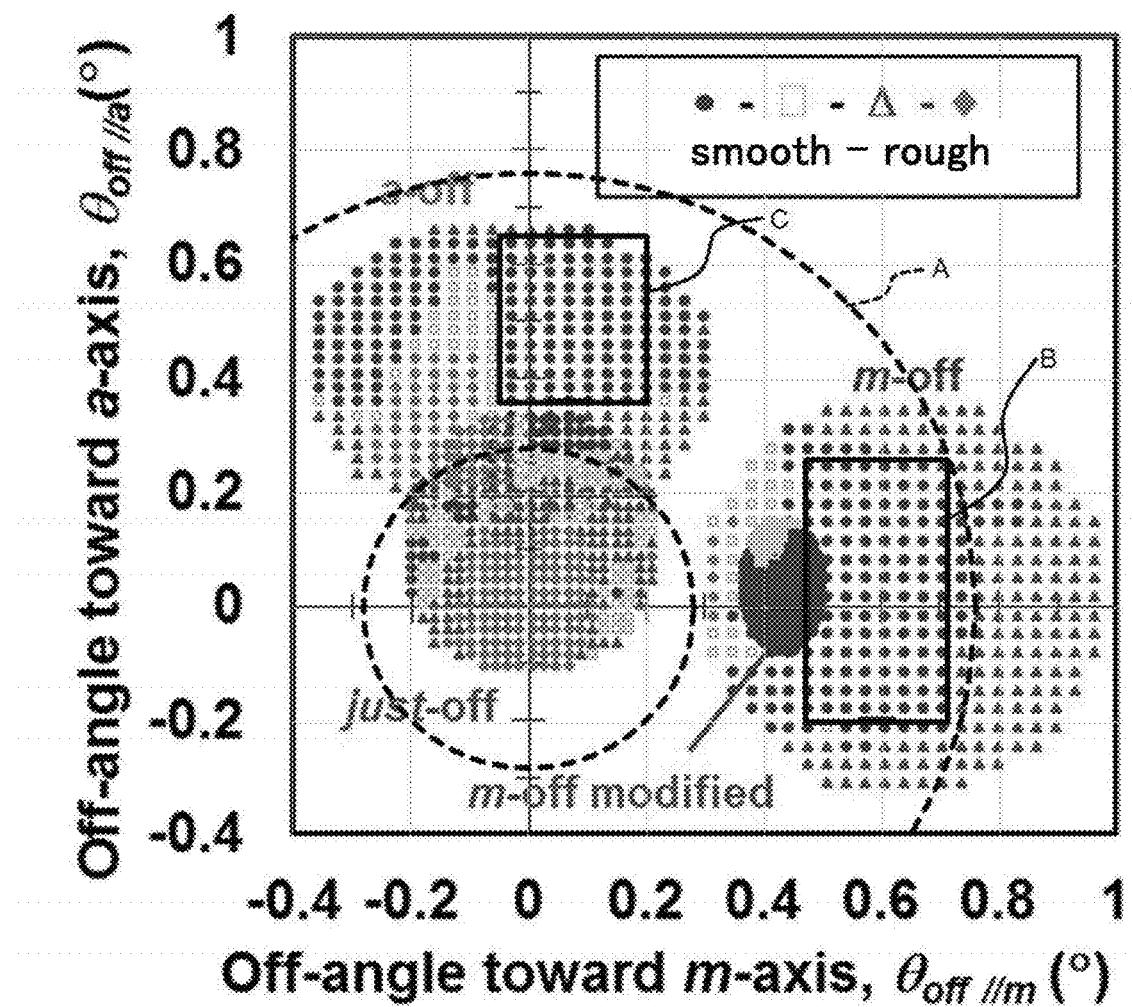
FIG. 3 is an off-angle coordinate map showing regions A, B, and C.

Next, classification of the good surface morphology region will be described with reference to FIG. 3. FIG. 3 is an off-angle coordinate map showing region A, B, and C. As shown in FIG. 3, for example, the good surface morphology region is classified into three regions (A, B, C) that can be represented by inequalities of the off-angle ($\theta_m$, $\theta_a$).

Region A shows a concentric circle region (donut-shaped region) in which the size θ of the off-angle is within a predetermined range, and a region including at least a part of the good surface morphology region. Specifically, region A is represented by the following formula, for example.

$$0.28 \leq \theta \leq 0.76$$

that is, $$0.0784 \leq \theta_m^2 + \theta_a^2 \leq 0.578 \quad (1)$$

Region B shows the region that is away from (0, 0) and is close to the $\theta_m$ axis, and the region entirely included in the good surface morphology region. That is, region B can be considered as a good surface morphology region on the m-off side. Specifically, region B is represented by, for example, the following formulas (2-1) and (2-2).

$$0.47 \leq \theta_m \leq 0.71 \quad (2\text{-}1)$$

$$-0.20 \leq \theta_a \leq 0.26 \quad (2\text{-}2)$$

Region C shows the region that is away from (0, 0) and close to the $\theta_a$ axis, and the region entirely included in the surface morphology good region. That is, region C can be considered as a good surface morphology region on the a-off side. Specifically, region C is represented by, for example, the following formulas (3-1) and (3-2).

$$-0.05 \leq \theta_m \leq 0.21 \quad (3\text{-}1)$$

$$0.36 \leq \theta_a \leq 0.65 \quad (3\text{-}2)$$

Figure 4:
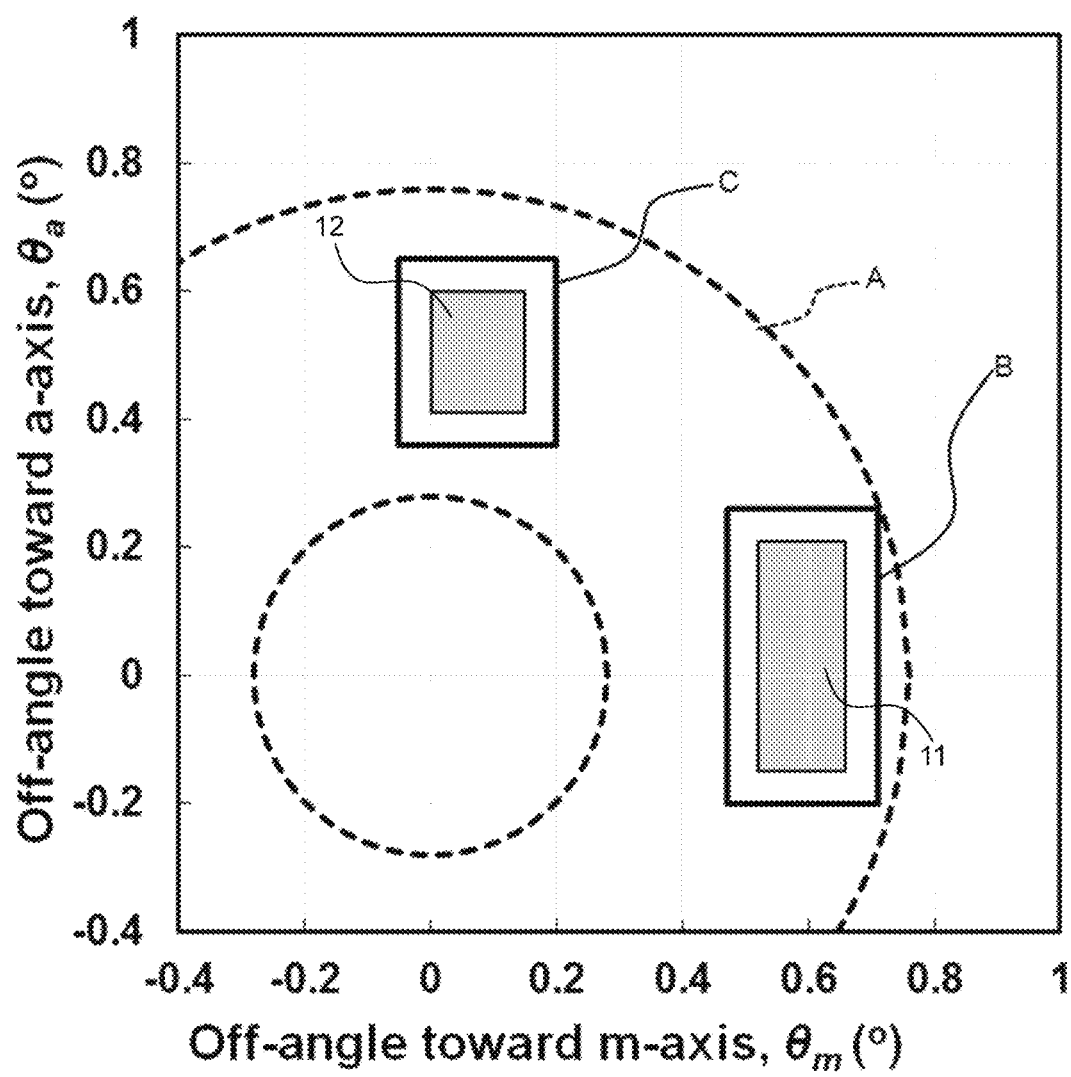
FIG. 4 is an off-angle coordinate map showing a relationship between the off-angle distribution of the nitride semiconductor substrate and the regions A, B, and C according to an embodiment of the present invention.

Next, with reference to FIG. 4, the relationship between the off-angle distribution of the substrate 10 of this embodiment and the good surface morphology region will be described. FIG. 4 is an off-angle coordinate map showing a relationship between the off-angle distribution of the nitride semiconductor substrate and the regions A, B, and C according to an embodiment of the present invention. In FIG. 4, as an ideal specific example of the substrate 10 of this embodiment, a first example is defined as "a substrate 11" and a second example is defined as "a substrate 12".

The main surface 10s of the substrate 10 of this embodiment does not include, for example, a region where the size of the off-angle is 0. That is, for example, the main surface 10s of the substrate 10 does not include a region where the off-angle $(\theta_m, \theta_a)$ is (0, 0). When the off-angle $(\theta_m, \theta_a)$ of the main surface 10s of the substrate 10 is close to (0, 0), as described above, the surface morphology of the semiconductor functional layer tends to be rough. Therefore, since the main surface 10s of the substrate 10 is configured to avoid this region, roughening of the surface morphology of the semiconductor functional layer can be suppressed.

The off-angle $(\theta_m, \theta_a)$ at least at a part of the main surface 10s of the substrate 10 of this embodiment is, for example, included in the region A and satisfies the above formula (1). Thereby, it is possible to obtain a portion where the surface morphology of the semiconductor functional layer is good, from at least a part of the semiconductor laminate in which the substrate 10 is used.

Further, the off-angle $(\theta_m, \theta_a)$ at least at the center O of the main surface 10s of the substrate 10 of this embodiment is for example, included in the region A and satisfies the above formula (1). Thereby, it is possible to widen a portion of the substrate 10 in which the off-angle $(\theta_m, \theta_a)$ is included in the region A in the main surface 10s. As a result, it is possible to obtain many portions where the surface morphology of the semiconductor functional layer is good, from the semiconductor laminate in which the substrate 10 is used.

Further, the proportion of the area of the region where the off-angle $(\theta_m, \theta_a)$ satisfies the formula (1), based on a total area of the main surface 10s of the substrate 10 of this embodiment is for example more than 50%, preferably 80% or more. Thereby, it is possible to stably obtain a portion where the surface morphology of the semiconductor functional layer is good, from the semiconductor laminate in which the substrate 10 is used. As a result, the yield of the semiconductor device can be improved.

The off-angle $(\theta_m, \theta_a)$ at least at a part of the main surface 10s of the substrate 10 of this embodiment is for example included in the region B and satisfies the above formulas (2-1) and (2-2). Thereby, it is possible to obtain a portion where the surface morphology of the semiconductor functional layer is good, from at least a part of the semiconductor laminate in which the substrate 10 is used.

Further, the off-angle $(\theta_m, \theta_a)$ at least at the center O of the main surface 10s of the substrate 10 of this embodiment is for example included in the region B and satisfies the above formulas (2-1) and (2-2). Thereby, it is possible to widen a portion where the off-angle $(\theta_m, \theta_a)$ is included in the region B in the main surface 10s of the substrate 10. As a result, it is possible to obtain many portions where the surface morphology of the semiconductor functional layer is good, from the semiconductor laminate in which the substrate 10 is used.

Further, the proportion of the area of the region where the off-angle $(\theta_m, \theta_a)$ satisfies the formulas (2-1) and (2-2), based on the total area of the main surface 10s of the substrate 10 of this embodiment is for example more than 50%, preferably 80% or more. Thereby, it is possible to stably obtain a portion where the surface morphology of the semiconductor functional layer is good, from the semiconductor laminate in which the substrate 10 is used. As a result, the yield of the semiconductor device can be improved.

In the substrate 11 as an ideal first example, for example, the entire off-angle distribution is included in the region B in the off-angle coordinate map. The proportion of the area of the region where the off-angle $(\theta_m, \theta_a)$ satisfies the formulas (2-1) and (2-2) based on the total area of the main surface 10s of the substrate 11, is for example 100%. Thereby, it is possible to reliably obtain a portion where the surface morphology of the semiconductor functional layer is good, from the entire semiconductor laminate in which the substrate 10 is used.

Alternatively, the off-angle $(\theta_m, \theta_a)$ at least at a part of the main surface 10s of the substrate 10 of this embodiment is, for example, included in the region C and satisfies the above formulas (3-1) and (3-2). Thereby, it is possible to obtain a portion where the surface morphology of the semiconductor functional layer is good, from at least a part of the semiconductor laminate in which the substrate 10 is used.

Further, the off-angle $(\theta_m, \theta_a)$ at least at the center O of the main surface 10s of the substrate 10 of this embodiment is, for example, included in the region C and satisfies the above formulas (3-1) and (3-2). Thereby, it is possible to widen a portion where the off-angle $(\theta_m, \theta_a)$ is included in the region C in the main surface 10s of the substrate 10. As a result, it is possible to obtain many portions where the surface morphology of the semiconductor functional layer is good, from the semiconductor laminate in which the substrate 10 is used.

Further, the proportion of the area of the region where the off-angle $(\theta_m, \theta_a)$ satisfies the above formulas (3-1) and (3-2), based on the total area of the main surface 10s of the substrate 10 of this embodiment is, for example, more than 50%, preferably 80% or more. Thereby, it is possible to stably obtain a portion where the surface morphology of the semiconductor functional layer is good, from the semiconductor laminate in which the substrate 10 is used. As a result, it is possible to improve the yield of the semiconductor device.

In the substrate 12 as an ideal second example, for example, the entire off-angle distribution is included in the region C in the off-angle coordinate map. The proportion of the area of the region where the off-angle $(\theta_w, \theta_a)$ satisfies the formulas (3-1) and (3-2), based on the total area of the main surface 10s of the substrate 12 is, for example, 100%. Thereby, it is possible to reliably obtain a portion where the surface morphology of the semiconductor functional layer is good, from the entire semiconductor laminate in which the substrate 10 is used.

Further, in the substrate 10 of this embodiment, as described above, since the radius of curvature of at least a part of the c-face 10f in the direction along the m-axis is different from the radius of curvature of the c-face 10f in the direction along the a-axis, the range of the off-angle m-axis component $\theta_m$ is different from the range of the off-angle a-axis component $\theta_a$ in the off-angle distribution of the substrate 10. Thereby, the off-angle distribution of the substrate 10 can be easily adjusted so as to correspond to a complicated distribution of the good surface morphology region in the off-angle coordinate map. As a result, a portion where the surface morphology of the semiconductor functional layer is good can be widened efficiently in the main surface 10s of the substrate 10.

Further, in the substrate 10 of this embodiment, as described above, since the radius of curvature of at least a part of the c-face 10f in the direction along the m-axis is larger than the radius of curvature of the c-face 10f in the direction along the a-axis, the range (width) of the off-angle m-axis component $\theta_m$ is, for example, narrower than the range (width) of the off-angle a-axis component $\theta_a$ in the off-angle distribution of the substrate 10. Here, in the good surface morphology region in the off-angle coordinate map described above, many areas are short in the $\theta_m$ axis direction and long in the $\theta_a$ axis direction. Therefore, in this embodiment, since the range of the off-angle m-axis component $\theta_m$ is narrower than the range of the off-angle a-axis component $\theta_a$, it is possible to easily adjust the off-angle distribution of the substrate 10 so as to match the region that is short in the $\theta_m$ axis direction and that is long in the $\theta_a$ axis direction in the good surface morphology region in the off-angle coordinate map. As a result, it is possible to more efficiently widen the portion where the surface morphology of the semiconductor functional layer is good in the main surface 10s of the substrate 10.

(Dislocation)

Figure 5:
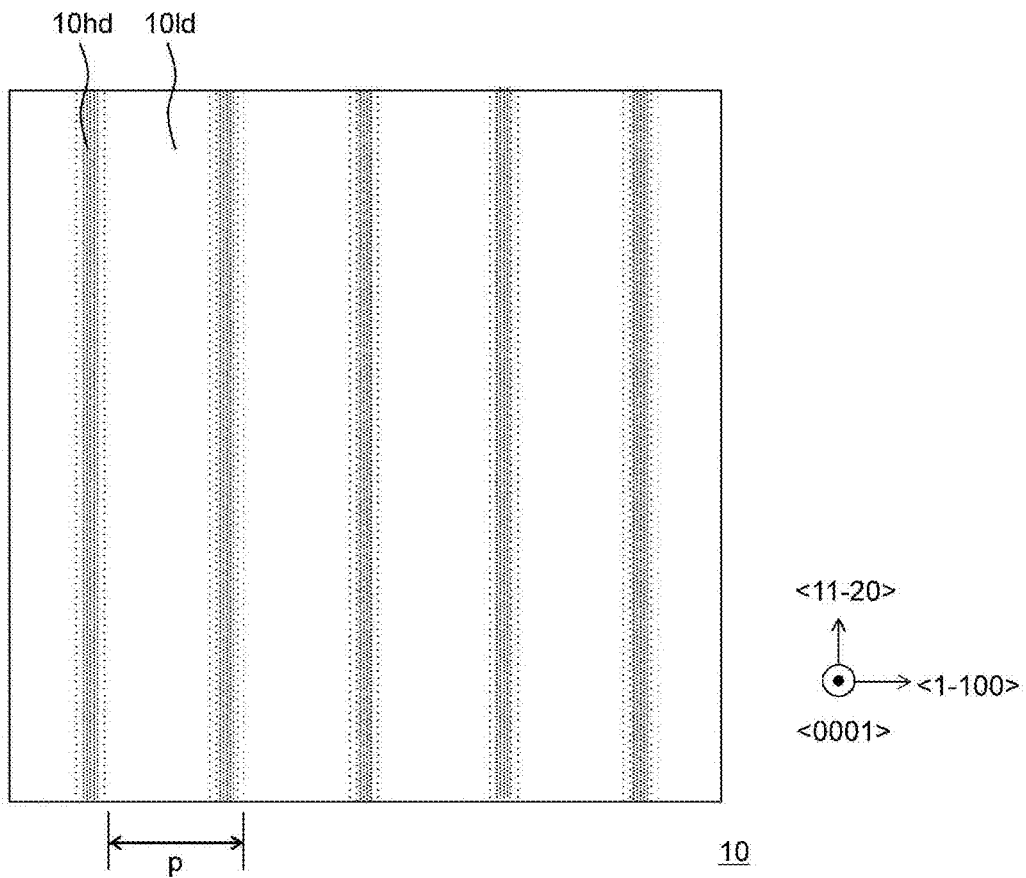
FIG. 5 is a schematic view showing a cathode luminescence image according to an embodiment of the present invention, in which a main surface of the nitride semiconductor substrate is enlarged.

Dislocation of the substrate 10 of this embodiment will be described with reference to FIG. 5. FIG. 5 is a schematic view showing a cathode luminescence image according to an embodiment of the present invention, in which a main surface of the nitride semiconductor substrate is enlarged. A square frame in FIG. 5 shows a predetermined field of view when the substrate is observed with a scanning electron microscope (SEM).

As shown in FIG. 5, in this embodiment, the substrate 10 has, for example, a plurality of dislocations extending in the direction along the c-axis 10c (the direction having the c-axis 10c component).

Here, in the manufacturing method described later, a substrate fabricated by a VAS method is used as the base substrate 7. In the base substrate 7 fabricated by the VAS method, the dislocation density is low. Specifically, the dislocation density in the main surface of the base substrate 7 is, for example, $1\times10^6$ cm$^{-2}$ or more and less than $1\times10^7$ cm$^{-2}$. In the substrate 10 obtained by the manufacturing method described below using the base substrate 7, the dislocation density is further decreased.

Specifically, the (maximum value of) the dislocation density in the main surface 10s of the substrate 10 of this embodiment is, for example, less than $1\times10^6$ cm$^{-2}$.

Further, in this embodiment, the substrate 10 has a high dislocation density region 10hd and a low dislocation density region 101d in the main surface 10s, due to the manufacturing method described later. The dislocation density of the low dislocation density region 101d is lower than the dislocation density of the high dislocation density region 10hd, and for example, less than $1\times10^5$ cm$^{-2}$.

A position of the high dislocation density region 10hd in plan view corresponds (overlaps) with a position of the mask layer 8 used in the manufacturing method described later. Each of the high dislocation density region 10hd and the low dislocation density region 101d, is formed into, for example, a stripe shape extending along one of the direction along the m-axis and the direction along the a-axis. The high dislocation density region 10hd and the low dislocation density region 101d, are provided, for example, alternately in the other direction of the direction along the m-axis and the direction along the a-axis.

In this embodiment, for example, each of the high dislocation density region 10hd and the low dislocation density region 101d, is formed into, for example, a stripe shape extending in the direction along the a-axis. The high dislocation density region 10hd and the low dislocation density region 101d are alternately provided in the direction along the m-axis perpendicular to the a-axis.

Further, a pitch p in a short direction (the direction perpendicular to the stripe) of the high dislocation density region 10hd or a width in a short direction of the low dislocation density region 101d corresponds to the pitch p of the mask layer 8 described later, and is, for example, 200 μm or more and 1 mm or less, preferably 600 μm or more and 1 mm or less.

Further, when the pitch p in the short direction of the high dislocation density region 10hd is within the above range, the low dislocation density region 101d includes, for example, a dislocation-free region of 50 μm square or more.

Further, in this embodiment, the dislocation density in the main surface of the base substrate 7 used in the manufacturing method described later is low, and therefore at the time of growing the semiconductor layer 9 on the base substrate 7, a plurality of dislocations are less likely to combine (mix). Thereby, generation of dislocations having a large Burgers vector can be suppressed in the substrate 10 obtained from the semiconductor layer 9.

Specifically, when a lattice constant in the a-axis direction is a and a lattice constant in the c-axis direction is c, the size of each Burgers vector of a plurality of dislocations included in the substrate 10 of this embodiment is, for example, any one of a, a+c, or c. Here, the "Burgers vector" can be measured by a large angle convergence electron diffraction method (LACBED method) using, for example, a transmission electron microscope (TEM). Further, dislocations whose Burgers vector size is a are edge dislocations, and dislocations whose Burgers vector size is a+c are mixed dislocations in which edge dislocations and screw dislocations are mixed, and dislocations whose Burgers vector size is c are screw dislocations.

(2) Manufacturing Method

Figure 6:
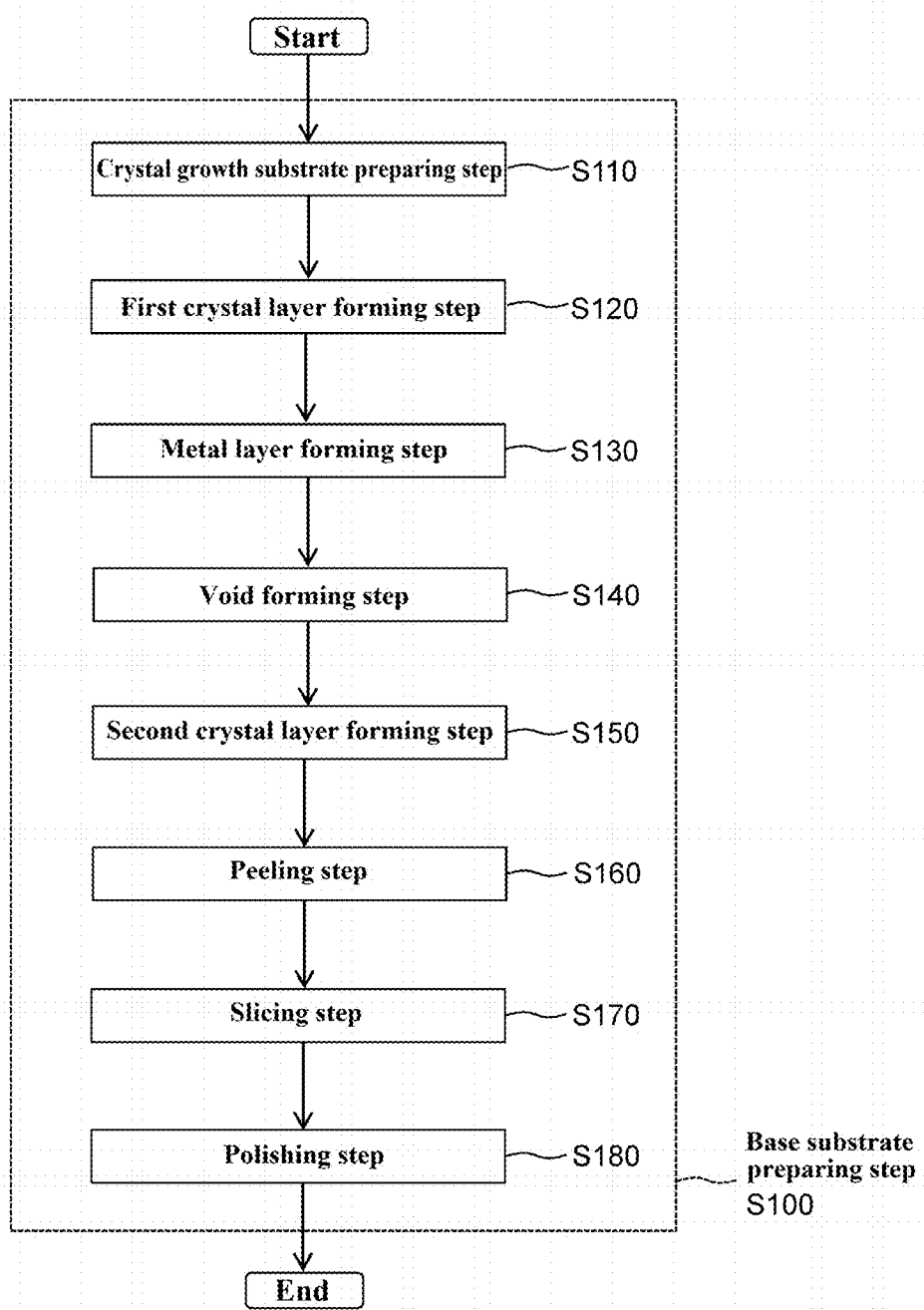
FIG. 6 is a flowchart showing a base substrate preparing step according to an embodiment of the present invention.
Figure 7:
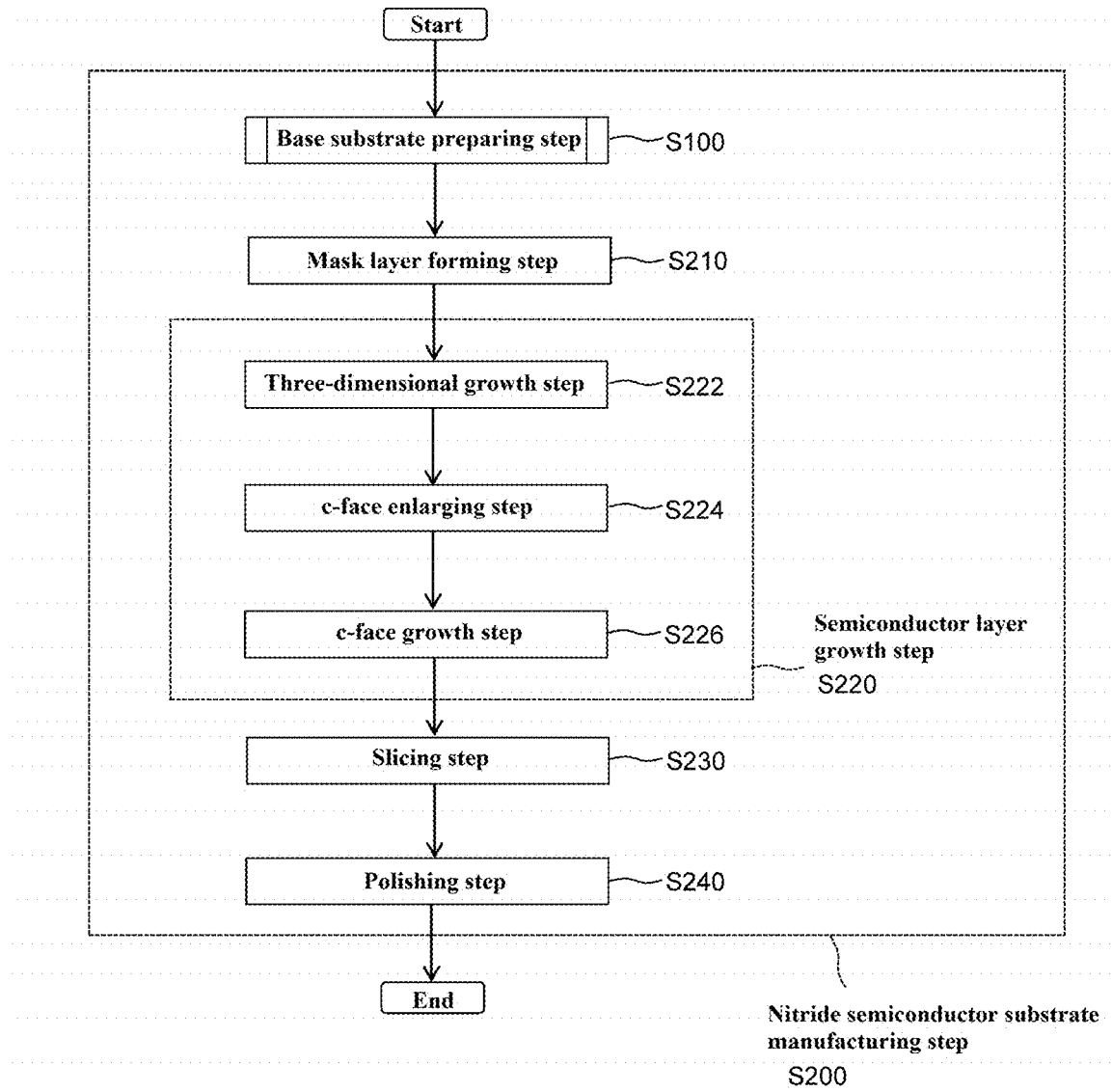
FIG. 7 is a flowchart showing a method for manufacturing a nitride semiconductor substrate according to an embodiment of the present invention.

Next, explanation is given for a method for manufacturing a nitride semiconductor substrate according to this embodiment, a method for manufacturing a semiconductor laminate according to this embodiment, and a method for manufacturing a semiconductor device according to this embodiment, with reference to FIG. 6 to FIG. 12. FIG. 6 is a flowchart showing a base substrate preparing step according to an embodiment of the present invention. FIG. 7 is a flowchart showing a method for manufacturing a nitride semiconductor substrate according to an embodiment of the present invention. FIG. 8 is a flowchart showing a method for manufacturing a semiconductor device according to an embodiment of the present invention. FIG. 9A to FIG. 9G are schematic sectional views showing the base substrate preparing step according to an embodiment of the present invention. FIG. 10A to FIG. 10C are schematic cross-sectional views showing a part of a method for manufacturing a nitride semiconductor substrate according to an embodiment of the present invention. FIGS. 11A to 11B are schematic cross-sectional views showing a part of a method for manufacturing a nitride semiconductor substrate according to an embodiment of the present invention. FIG. 12A to FIG. 12C are schematic cross-sectional views showing a part of a method for manufacturing a semiconductor device according to an embodiment of the present invention. In FIG. 10B and FIG. 10C, thin solid lines indicate the crystal plane in the middle of growth, and in FIG. 10B, FIG. 10C, FIG. 11A, and FIG. 11B, dotted lines indicate dislocations.

As shown in FIG. 8, the method for manufacturing a semiconductor device according to this embodiment, includes: for example, a nitride semiconductor substrate manufacturing step S200; an off-angle measuring step S320; a substrate sorting step S340; a semiconductor laminate manufacturing step S400; a semiconductor device manufacturing step S500; and a semiconductor device sorting step S600.

Further, as shown in FIG. 7, the method for manufacturing a nitride semiconductor substrate according to this embodiment (nitride semiconductor substrate manufacturing step S200), includes: for example a base substrate preparing step S100; a mask layer forming step S210; a semiconductor layer growth step S220, a slicing step S230, and a polishing step S240.

(S100: Base Substrate Preparing Step)

First, the base substrate preparing step S100 is performed. In the base substrate preparing step S100 of this embodiment, for example, the base substrate 7 is fabricated by a VAS (Void-Assisted Separation) method.

As shown in FIG. 6, specifically, the base substrate preparing step S100 of this embodiment includes, for example a crystal growth substrate preparing step S110; a first crystal layer forming step S120; a metal layer forming step S130; a void forming step S140; a second crystal layer forming step S150; a peeling step S160; a slicing step S170; and a polishing step S180.

(S110: A Crystal Growth Substrate Preparing Step)

Figure 9A:
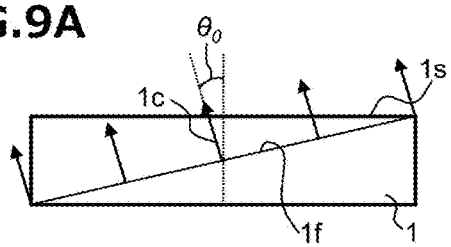
FIG. 9A to FIG. 9G are schematic sectional views showing the base substrate preparing step according to an embodiment of the present invention.

First, as shown in FIG. 9A, a crystal growth substrate 1 (it is sometimes abbreviated as "substrate 1" hereafter) is prepared. The substrate 1 is, for example, a sapphire substrate. The substrate 1 may be, for example, a Si substrate or a gallium arsenide (GaAs) substrate. The substrate 1 has, for example, a main surface 1s which is a growth surface. The low index crystal plane nearest to the main surface 1s is, for example, a c-face 1f.

In this embodiment, the c-face 1f of the substrate 1 is inclined with respect to the main surface 1s. The c-axis 1c of the substrate 1 is inclined at a predetermined off-angle $\theta_0$ with respect to the normal of the main surface 1s. The off-angle $\theta_0$ in the main surface is of the substrate 1 is uniform over the entire main surface 1s. The off-angle $\theta_0$ in the main surface is of the substrate 1 affects the off-angle ($\theta_m$, $\theta_a$) at the center O of the main surface 10s of the substrate 10.

(S120: First Crystal Layer Forming Step)

Figure 9B:
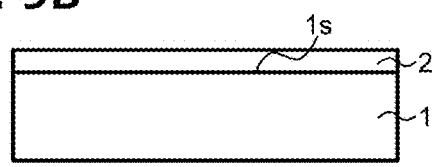

Next, as shown in FIG. 9B, for example, a low-temperature-grown GaN buffer layer and a single-crystal Si-doped GaN layer as a first crystal layer (base growth layer) 2 are grown in this order on the main surface is of the substrate 1, by supplying trimethylgallium (TMG) gas, ammonia gas ($NH_3$) and monosilane ($SiH_4$) gas to the substrate 1 heated to a predetermined growth temperature, by a metal organic chemical vapor deposition (MOVPE) method for example. At this time, the thickness of the low-temperature-grown GaN buffer layer and the thickness of the Si-doped GaN layer are, for example, 20 nm and 0.5 respectively.

(S130: Metal Layer Forming Step)

Figure 9C:
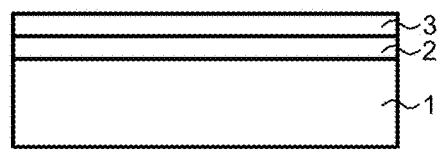

Next, as shown in FIG. 9C, a metal layer 3 is vapor-deposited on the first crystal layer 2. The metal layer 3 is, for example, a titanium (Ti) layer. Further, the thickness of the metal layer 3 is, for example, 20 nm.

(S140: Void Forming Step)

Figure 9D:
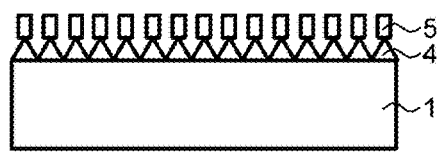
Figure 9E:
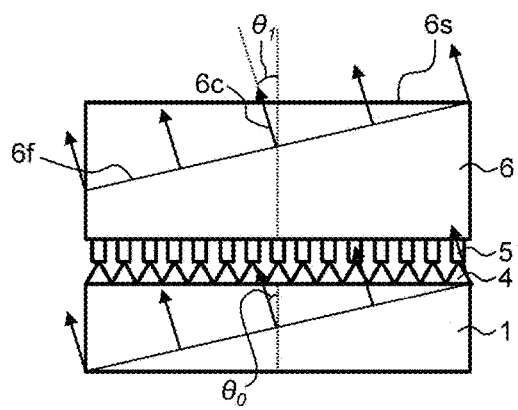

Next, as shown in FIG. 9D, the substrate 1 is placed in an electric furnace, and the substrate 1 is placed on a susceptor having a predetermined heater. After placing the substrate 1 on the susceptor, the substrate 1 is heated by a heater, and heat treatment is performed in an atmosphere containing hydrogen gas or hydride gas. Specifically, for example, heat treatment is performed for 20 minutes at a predetermined temperature in a hydrogen ($H_2$) gas flow containing 20% $NH_3$ gas. The heat treatment temperature is, for example, 850° C. or more and 1100° C. or less. By performing such a heat treatment, the metal layer 3 is nitrided, and a metal nitride layer 5 having fine holes at high density on the surface is formed. Further, by performing the above heat treatment, a part of the first crystal layer 2 is etched through the hole of the metal nitride layer 5 to form a high density void in the first crystal layer 2. Therefore, a void-containing first crystal layer 4 is formed.

(S150: Second Crystal Layer Forming Step)

Next, for example, Si-doped GaN layer as a second crystal layer (full-growth layer) 6 is epitaxially grown on the void-containing first crystal layer 4 and the metal nitride layer 5, by supplying gallium chloride (GaCl) gas, $NH_3$ gas and dichlorosilane ($SiH_2Cl_2$) gas as n-type dopant gas, to the substrate 1 heated to a predetermined growth temperature, by a hydride vapor phase epitaxy (HVPE) method. A Ge-doped GaN layer may also be epitaxially grown as the second crystal layer 6 by supplying tetrachlorogermane ($GeCl_4$) gas or the like as the n-type dopant gas, instead of the $SiH_2Cl_2$ gas.

At this time, the second crystal layer 6 grows on the void-containing first crystal layer 4 and the metal nitride layer 5, from the void-containing first crystal layer 4 through the hole of the metal nitride layer 5. Although a part of the voids in the void-containing first crystal layer 4 is buried by the second crystal layer 6, the other part of the voids in the void-containing first crystal layer 4 is remained. A flat air gap is formed between the second crystal layer 6 and the metal nitride layer 5, due to the voids remaining in the void-containing first crystal layer 4. This air gap causes peeling of the second crystal layer 6 in a peeling step S160 described later.

Further, at this time, the second crystal layer 6 is grown by inheriting an orientation of the substrate 1. That is, the off-angle $\theta_1$ in the main surface of the second crystal layer 6 is uniform over the entire main surface like the off-angle $\theta_0$ in the main surface is of the substrate 1.

Further, at this time, after the second crystal layer 6 is flattened, the flat second crystal layer 6 is grown with only the c-face as a growth surface, without causing facets other than the c-face to generate on the main surface of the second crystal layer 6 (without three-dimensionally growing).

Further, at this time, the thickness of the second crystal layer 6 is, for example, 600 μm or more, preferably 1 mm or more. An upper limit value of the thickness of the second crystal layer is not particularly limited. However, it is preferable that the thickness of the second crystal layer 6 be 50 mm or less, from a viewpoint of productivity improvement.

(S160: Peeling Step)

After end of the growth of the second crystal layer 6, the second crystal layer 6 is naturally separated from the substrate 1 with the void-containing first crystal layer 4 and the metal nitride layer 5 as boundaries, in the step of cooling the HVPE apparatus used for growing the second crystal layer 6.

At this time, tensile stress is introduced into the second crystal layer 6. Therefore, internal stress acts on the second crystal layer 6 such that the surface side of the second crystal layer 6 is concave due to the tensile stress generated in the second crystal layer 6. Further, the dislocation density on the main surface (front surface) side of the second crystal layer 6 is low, and meanwhile, the dislocation density on the back surface side of the second crystal layer 6 is high. Therefore, the internal stress acts on the second crystal layer 6 such that the surface side of the second crystal layer 6 is concave due to a difference in dislocation density in the thickness direction of the second crystal layer 6.

Figure 9F:
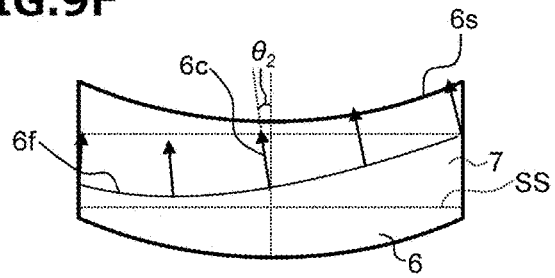

As a result, as shown in FIG. 9F, after the second crystal layer 6 is peeled from the substrate 1, the second crystal layer 6 warps so that the surface side is concave. Therefore, the c-face 6*f* of the second crystal layer 6 is curved in a concave spherical shape with respect to a surface perpendicular to the normal direction of the center of the main surface 6*s* of the second crystal layer 6. The off angle $\theta_2$ formed by the c-axis 6*c* with respect to the normal of the center of the main surface 6*s* of the second crystal layer 6 has a predetermined distribution.

(S170: Slicing Step)

Next, as shown in FIG. 9F, for example, the second crystal layer 6 is sliced with a wire saw, along a cut surface SS substantially perpendicular to the normal direction of the center of the main surface 6*s* of the second crystal layer 6.

Figure 9G:
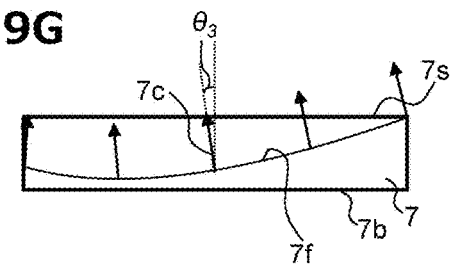

Thereby, as shown in FIG. 9G, a base substrate 7 as an as-sliced substrate is formed. At this time, the thickness of the base substrate 7 is, for example, 450 µm. The off-angle $\theta_3$ of the base substrate 7 may be varied from the off angle $\theta_2$ of the second crystal layer 6, depending on slice direction dependence.

(S180: Polishing Step)

Next, both surfaces of the base substrate 7 are polished by a polishing apparatus.

Through the base substrate preparing step S100 described above, the base substrate 7 containing GaN is obtained. The c-face 7*f* of the base substrate 7 is curved in a concave spherical shape with respect to the main surface 7*s* of the base substrate 7. The off angle $\theta_3$ formed by the c-axis 7*c* with respect to the normal of the center of the main surface 7*s* of the base substrate 7 has a predetermined distribution. As described above, the radius of curvature of the c-face 7*f* in the base substrate 7 is, for example, 1 m or more and less than 10 m.

(S210: Mask Layer Forming Step)

After preparing the base substrate 7, a mask layer 8 is formed on the base substrate 7 by, for example, sputtering. The mask layer 8 is, for example, a silicon oxide (SiO$_2$) layer or a silicon nitride (SiN) layer. At this time, the thickness of the mask layer 8 is 300 nm or more and 2 µm or less. After forming the mask layer 8, the mask layer 8 is patterned by photolithography.

Figure 10A:
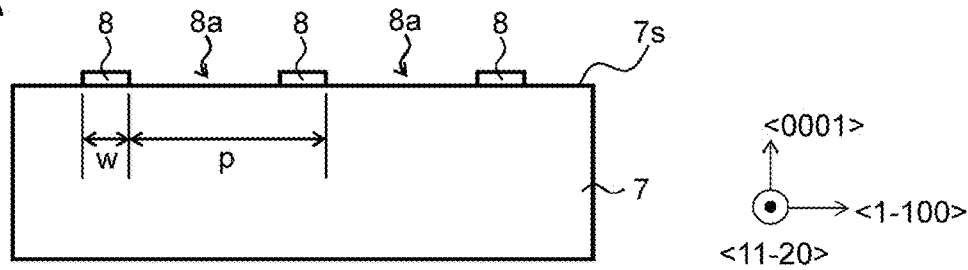
FIG. 10A to FIG. 10C are schematic cross-sectional views showing a part of a method for manufacturing a nitride semiconductor substrate according to an embodiment of the present invention.

Thereby, as shown in FIG. 10A, the mask layer 8 having a predetermined opening 8*a* is formed.

At this time, the opening 8*a* of the mask layer 8 is formed, for example, in a stripe shape extending along one of the direction along the m-axis and the direction along the a-axis. The case referred to here such that the opening 8*a* of the mask layer 8 is "in a stripe shape extending along one of the direction along the m-axis and the direction along the a-axis" includes not only a case that the direction in which the stripe-shaped opening 8*a* extends is a direction that completely matches the direction along the m-axis or the direction along the a-axis in plan view, but also a case that the direction in which the stripe-shaped opening 8*a* is a direction slightly inclined with respect to the direction along the m-axis or the direction along the a-axis. In at least one unit opening portion constituting the stripe-shaped opening 8*a*, it may be considered to set a length of one direction component in the direction along the m-axis or the direction along the a-axis to be longer than a length of the other direction component. At least one unit opening constituting the stripe-shaped opening 8*a* does not necessarily have to extend from one end to the other end of the main surface 7*s* of the base substrate 7. Specifically, for example, the mask layer 8 has a lattice shape, and the opening 8*a* may have a plurality of substantially rectangular unit opening portions.

In this embodiment, for example, the opening 8*a* of the mask layer 8 is formed in a stripe shape extending in the direction along the a-axis.

At this time, each width (width in a short direction) w of the stripe-shaped mask layer 8 is, for example, 1 µm or more and 100 µm or less, preferably 5 µm or more and 30 µm or less. If the width w of the mask layer 8 is less than 1 µm, disconnection of the mask layer 8 is liable to occur and the yield of patterning may be decreased. In contrast, since the width w of the mask layer 8 is 1 µm or more, disconnection of the mask layer 8 can be suppressed and the yield of patterning can be improved. Further, since the width w of the mask layer is 8 to 5 µm or more, the yield of patterning can be further improved. Meanwhile, if the width w of the mask layer 8 is more than 100 µm, there is a possibility that c-face 91*cf* is bent when the three-dimensional growth layer 91 grows on the mask layer 8 with the facet 91*ff* as a growth surface in the three-dimensional growth step S222 described later. Further, if the width w of the mask layer 8 is more than 100 µm, there is a possibility that abnormal crystal nuclei are generated on the mask layer 8. In contrast, since the width w of the mask layer 8 is 100 µm or less, bending of the c-face 91*cf* during growth on the mask layer 8 can be suppressed. Further, since the width w of the mask layer 8 is 100 µm or less, occurrence of abnormal crystal nuclei on the mask layer 8 can be suppressed. Further, since the width w of the mask layer 8 is 30 µm or less, the curvature of the c-face 91*cf* can be stably suppressed during growth on the mask layer 8, and the generation of the abnormal crystal nuclei on the mask layer 8 can be stably suppressed.

Further, as described above, pitch p of each of stripe-shaped mask layer 8 affects the pitch p in the short direction of the high dislocation density region 10*hd* (the width in the short direction of the low dislocation density region 101*d*). Conventionally, in the case that the pitch p of the mask layer 8 is wide, it has been difficult to stably grow the semiconductor layer. However, in this embodiment, since a substrate manufactured by the VAS method is used as the base substrate 7, the semiconductor layer 9 can be stably grown even if the pitch p of the mask layer 8 is wide.

Specifically, in this embodiment, the pitch p of each of the mask layers 8 is, for example, 200 µm or more and 1 mm or less, preferably 600 µm or more and 1 mm or less. If the pitch p of the mask layer 8 is less than 200 there is a high possibility that the high dislocation density region 10*hd* is included in the semiconductor device when the semiconductor device is cut out from the substrate 10. In contrast, since the pitch p of the mask layer 8 is 200 µm or more, it is possible to prevent the high dislocation density region 10*hd* from being included in the semiconductor device, and to cut out the semiconductor device mainly from the low dislocation density region 101*d*. Further, since the pitch p of the mask layer 8 is 600 µm or more, it is possible to stably cut out the semiconductor device from the low dislocation density region 101*d*, even in a case that the semiconductor device is a high power light emitting diode or the like, because a chip size of the semiconductor device such as a high power light emitting diode (LED) is 600 µm or more and 1 mm or less. Meanwhile, if the pitch p of the mask layer 8 is more than 1 mm, there is a possibility that a required thickness until the surface of the semiconductor layer 9 is flattened becomes excessively thick in the later-described c-face enlarging step S224. In contrast, since the pitch p of the mask layer 8 is 1 mm or less, it is possible to suppress excessive increase in the required thickness until the surface of the semiconductor layer 9 is flattened.

(S220: Semiconductor Layer Growth Step)

After forming the mask layer 8, a semiconductor layer growth step S220 is performed. In the semiconductor layer growth step S220 of this embodiment, the semiconductor layer 9 containing a group III nitride semiconductor is epitaxially grown on the base substrate 7 through the opening 8a of the mask layer 8, for example, by a so-called Epitaxial Lateral Overgrowth (ELO) method.

As shown in FIG. 7, specifically, the semiconductor layer growth step S220 of this embodiment includes: for example, a three-dimensional growth step S222, a c-face enlarging step S224, and a c-face growth step S226.

(S222: Three-Dimensional Growth Step)

Figure 10B:
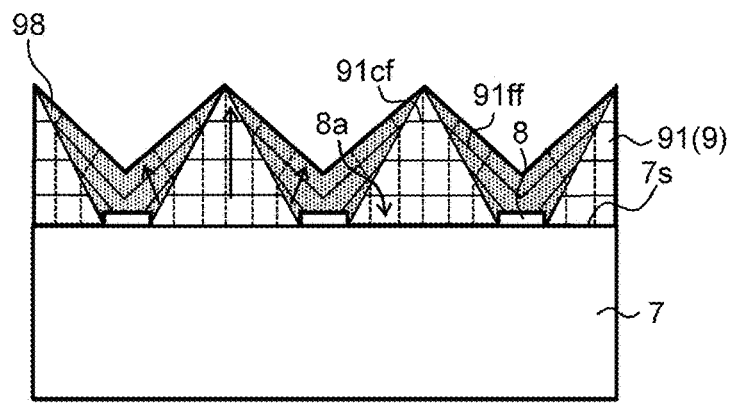

As shown in FIG. 10B, for example, the GaN layer as the semiconductor layer 9 is epitaxially grown selectively on the main surface 7s of the base substrate 7 exposed in the opening 8a of the mask layer 8, by supplying GaCl gas and NH$_3$ gas to the base substrate 7 heated to a predetermined growth temperature.

At this time, a three-dimensional growth layer 91 of the semiconductor layer 9 is three-dimensionally grown on the base substrate 7 exposed in the opening 8a of the mask layer 8, and the facet 91ff other than the c-face 91cf is exposed. Just on the upper side of the opening 8a of the mask layer 8, the three-dimensional growth layer 91 grows in the normal direction (direction along the c-axis) of the main surface 7s of the base substrate 7, with the c-face 91cf as a growth surface. Meanwhile, on the mask layer 8, growth of the three-dimensional growth layer 91 is suppressed. Thereby, facet 91ff other than the c-face 91cf can be exposed in the three-dimensional growth layer 91.

Further, at this time, in this embodiment, since the opening 8a of the mask layer 8 is formed in a stripe shape extending in the direction along the a-axis, for example, a plane parallel to the a-axis and inclined from the m-face, can be exposed as the facet 91ff of the three-dimensional growth layer 91. In a group III nitride semiconductor, a plane parallel to the a-axis and inclined from the m-face tends to be exposed in a state of being smoother than the other faces. Thereby, the three-dimensional growth layer 91 having good crystallinity can be stably grown.

When the three-dimensional growth layer 91 of the semiconductor layer 9 is further grown, a part of the three-dimensional growth layer 91, is grown on the mask layer 8, with the facet 91ff other than the c-face 91cf as a growth surface.

At this time, in the three-dimensional growth layer 91 of the semiconductor layer 9, the portion where the semiconductor layer is grown with the facet 91ff as a growth surface, is easy to incorporate oxygen, compared with the other portion where the semiconductor layer is grown with the c-face as the growth surface. Therefore, in this embodiment, oxygen is incorporated through the facet 91ff into the portion where the semiconductor layer is grown with the facet 91ff as a growth surface, and a high oxygen concentration layer 98 (dot hatched portion in the figure) having oxygen concentration higher than that of the other portion is formed in the semiconductor layer 9.

At this time, the oxygen incorporated into the high oxygen concentration layer 98 is, for example, the oxygen unintentionally mixed in the HVPE apparatus, or the oxygen etc. released from members constituting the HVPE apparatus (quartz members etc.). Oxygen-containing gas may be positively supplied into the HVPE apparatus in at least the three-dimensional growth step S222 and the later-described c-face enlarging step S224.

In this way, since the oxygen is incorporated into the high oxygen concentration layer 98, the lattice constant of the high oxygen concentration layer 98 can be larger than the lattice constant of the other portion of the semiconductor layer 9 (Reference: Chris G. Van de Walle, Physical Review B vol. 68, 165209 (2003)). Stress concentrating toward the center of curvature of the c-face is added on the base substrate 7 and the portion of the three-dimensional growth layer 91 grown with the c-face 91cf as a growth surface, due to the curvature of the c-face 7f of the base substrate 7. In contrast, since the lattice constant of the high oxygen concentration layer 98 is relatively increased, it is possible to generate a stress expanding the c-face outward in a creeping surface direction in the high oxygen concentration layer 98. Thereby, the stress concentrating toward the center of curvature of the c-face on the lower side of the high oxygen concentration layer 98 and the stress expanding the c-face of the high oxygen concentration layer 98 outward in the creeping surface direction, can be cancel each other (Hereinafter also referred to as "stress canceling effect" by the high oxygen concentration layer).

At this time, the oxygen concentration in the high oxygen concentration layer 98 is, for example, $3 \times 10^{18}$ cm$^{-3}$ or more and $5 \times 10^{19}$ cm$^{-3}$ or less. The oxygen concentration in the other portion of the semiconductor layer 9 is, for example, lower than a detection lower limit by secondary ion mass spectrometry (SIMS), and specifically $2 \times 10^{16}$ cm$^{-3}$ or less. Since the oxygen concentration in the high oxygen concentration layer 98 is $3 \times 10^{18}$ cm$^{-3}$ or more, a difference in desired lattice constant can be generated between the high oxygen concentration layer 98 and the other portion. Thereby, in the high oxygen concentration layer 98, it is possible to generate a desired stress expanding the c-face outward in the creeping surface direction. Meanwhile, since the oxygen concentration in the high oxygen concentration layer 98 is $5 \times 10^{19}$ cm$^{-3}$ or less, good crystallinity of the high oxygen concentration layer 98 can be maintained even in a state containing oxygen.

When the three-dimensional growth layer 91 further grows, adjacent three-dimensional growth layers 91 sandwiching the mask layer 8 are associated with each other. When the adjacent three-dimensional growth layers 91 are associated with each other, the inclination angle of the facet 91ff other than the c-face 91cf with respect to the main surface 7s of the base substrate 7 is gradually decreased, toward an upper side of the main surface 7s of the base substrate 7.

When the three-dimensional growth layer 91 further grows, the c-face 91cf gradually shrinks toward the upper side of the main surface 7s of the base substrate 7, and finally, the c-face 91cf disappears in the upper side of the opening 8a of the mask layer 8. Since the c-face 91cf disappears from the three-dimensional growth layer 91, a three-dimensional growth layer 91 having a substantially triangular pillar shape can be formed.

In a growth step of the three-dimensional growth layer 91 as described above, a part of a plurality of dislocations extending in the direction along the c-axis in the base substrate 7 is blocked by the mask layer 8, and is suppressed to propagate to the three-dimensional growth layer 91. Thereby, the dislocation density on the main surface of the semiconductor layer 9 can be reduced. Meanwhile, the other part of the plurality of dislocations extending in the direction along the c-axis in the base substrate 7, propagates in the direction along the c-axis of the three-dimensional growth layer 91 from the base substrate 7 through the opening 8a of the mask layer 8. Dislocations propagated in the direction along the c-axis of the three-dimensional growth layer 91, bend and propagate in a direction substantially perpendicular to the facet 91ff, at a position where the facet 91ff other than the c-face 91cf of the three-dimensional growth layer 91 is exposed. That is, the dislocations propagate while bending in a direction inclined with respect to the c-axis. Thereby, in the later-described c-face enlarging step S224, the dislocations are locally collected on the upper side of the opening 8a of the mask layer 8.

In the above three-dimensional growth step S222, a growth condition is set so that, for example, a growth rate in the direction along the c-axis is higher than a growth rate in the direction other than the direction along the c-axis (that is, so that growth is promoted in the direction along the c axis). Specific growth conditions are, for example, as follows.
Growth temperature: 940° C. or more and 1030° C. or less
Growth pressure: 90 to 105 kPa, preferably 90 to 95 kPa
Partial pressure of GaCl gas: 1.5 to 15 kPa
Partial pressure of $NH_3$ gas/partial pressure of GaCl gas: 1 to 20
Flow rate of $N_2$ gas/Flow rate of $H_2$ gas: 0 to 1

Further, a height in a thickness direction (a maximum value of the thickness) of the three-dimensional growth layer 91 in the three-dimensional growth step S222 is set to, for example, ½ to 4 times the pitch p of each of mask layer 8.

(S224: c-Face Enlarging Step)

Figure 10C:
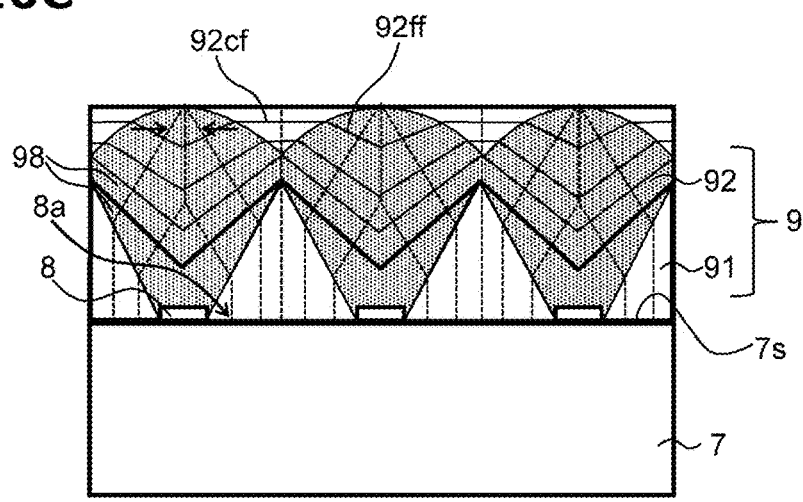

When the c-face 91cf completely disappears from the three-dimensional growth layer 91, as shown in FIG. 10C, a c-face enlarged layer 92 is formed on the three-dimensional growth layer 91. Specifically, the c-face enlarged layer 92 is laterally grown from the facet 91ff of the substantially triangular pillar-shaped three-dimensional growth layer 91, with the facet 92ff as a growth surface. Thereby, the once disappeared c-face 92cf starts to be exposed again. After exposing the c-face 92cf, the c-face enlarged layer 92 grows while gradually enlarging the c-face 92cf toward the upper side of the main surface 7s of the base substrate 7. Since the c-face 92cf gradually enlarges, the facet 92f gradually shrinks, and V-shaped concave portions (not numbered) formed on the upper side of the mask layer 8 are gradually decreased. Thereafter, when the c-face enlarged layer 92 further grows, the facet 92ff completely disappears, and the main surface of the c-face enlarged layer 92 becomes a flat surface constituted only by the c-face 92cf.

At this time, in the same way as the three-dimensional growth step S222, oxygen is incorporated through the facet 92ff into the portion of the c-face enlarged layer 92 grown with the facet 92ff as the growth surface, and the high oxygen concentration layer 98 is formed at the portion. Incorporation of the oxygen is suppressed in the portion of the c-face enlarged layer 92 grown with the c-face 92cf as the growth surface.

Further, at this time, the high oxygen concentration layer 98 is continuously formed in the semiconductor layer 9 in the direction along the main surface. Specifically, first, the c-face enlarged layer 92 is three-dimensionally grown with the facet 92ff as the growth surface, in a state with the c-face made disappear on the upper side of the opening 8a of the mask layer 8, for a predetermined period after the three-dimensional growth step S222. Thereby, the high oxygen concentration layer 98 is also formed on the top of the three-dimensional growth layer 91. Thereafter, the facet 92ff gradually shrinks by exposing the c-face 92cf and enlarging the c-face 92cf. Thereby, the high oxygen concentration layer 98 is formed so as to bury the V-shaped concave portions between the adjacent three-dimensional growth layers 91. The portions of the high oxygen concentration layer 98 in which the concave portions between the adjacent three-dimensional growth layers 91 are buried, are continuously connected through a portion formed on the top of the three-dimensional growth layer 91. In this way, it is possible to form the high oxygen concentration layer continuously in the direction along the main surface in the semiconductor layer 9. As a result, stress canceling effect by the high oxygen concentration layer 98 can be reliably obtained over the entire main surface.

Further, at this time, since the opening 8a of the mask layer 8 is formed into a stripe shape extending along one of the direction along the m-axis and the direction along the a-axis, the thickness distribution of the high oxygen concentration layer 98 can be made into a stripe-shaped distribution following the shape of the opening 8a of the mask layer 8. Specifically, as described above, since the high oxygen concentration layer 98 is formed so as to bury the concave portions between the adjacent three-dimensional growth layers 91, the sectional shape of the lower side of the high oxygen concentration layer 98 facing the mask layer 8 is substantially V-shaped. Further, since the c-face 92cf is enlarged while growing the c-face enlarged layer 92 in the lateral direction, a curved convex is formed on the upper side of the mask layer 8 of the high oxygen concentration layer 98. Thereby, the thickness of the high oxygen concentration layer 98 is gradually increased from the center of the opening 8a toward the center of the mask layer 8 in the direction perpendicular to the extending direction of the mask layer 8. That is, the high oxygen concentration layer 98 can be formed, alternately having a thick portion and a thin portion in the direction perpendicular to the extending direction of the mask layer 8, in a so-called bellows shape. As a result, it is possible to cause direction dependence in the stress canceling effect by the high oxygen concentration layer 98.

In this embodiment, since the opening 8a of the mask layer 8 is formed in the stripe shape extending in the direction along the a-axis, the high oxygen concentration layer 98 can be formed, alternately having a thick portion and a thin portion in the direction along the m-axis in the bellows shape. Thereby, in the stress cancelling effects by the high oxygen concentration layer 98, the effect in the direction along the a-axis is uniform in this direction, and meanwhile the effect in the direction along the m-axis is periodic in this direction and can be improved more than the effect in the direction along the a-axis.

Further, at this time, since the dislocations (dotted lines in the figure) are collected locally in the growth step of the three-dimensional growth layer 91 and the c-face enlarged layer 92, it is possible to decrease the dislocation density on the main surface of the semiconductor layer 9, and form the high dislocation density region and the low dislocation density region on the main surface of the semiconductor layer 9. Specifically, as described above, the dislocations propagating in the direction along the c-axis of the three-dimensional growth layer 91, bend and propagate in the direction inclined with respect to the c-axis, at the position where the facet 91ff is exposed. The dislocations propagated in the direction inclined with respect to the c-axis in the three-dimensional growth layer 91, continues to propagate in the same direction in the c-face enlarged layer 92 as well. The dislocations propagated in the direction inclined with respect to the c-axis in the c-face enlarged layer 92, are collected at the center of the mask layer 8 in the direction perpendicular to the extending direction of the mask layer 8. A part of the plurality of dislocations collected at the center of the mask layer 8 propagates to the main surface (upper surface) of the semiconductor layer 9, with the propagation direction thereof being again changed from the direction inclined with respect to the c-axis to the direction along the c-axis. Since the dislocations are collected locally in this way, the high dislocation density region is formed on the upper side of the portion of the semiconductor layer 9 where dislocations are collected at the center of the mask layer 8. Meanwhile, since the dislocations propagating in the direction along the c-axis are decreased, the low dislocation density region can be formed on the upper side of the portion of the semiconductor layer 9 where the dislocations are propagated in the direction inclined with respect to the c-axis (the portion from the center of the opening 8$a$ to the center of the mask layer 8).

Further, at this time, the growth temperature in the c-face enlarging step S224 is maintained at a growth temperature equal to the growth temperature in the three-dimensional growth step S222. For example, other growth conditions in the c-face enlarging step S224 are also maintained at the same conditions as the other growth conditions in the three-dimensional growth step S222. Since the growth conditions are maintained in this way, good crystallinity of the high oxygen concentration layer 98 can be maintained even when the high oxygen concentration layer 98 contains oxygen.

Further, the height in the thickness direction (the maximum value of the thickness) of the c-face enlarged layer 92 in the c-face enlarging step S224 is, for example, ½ to 4 times the pitch p of each of mask layers 8.

(S226: c-Face Growth Step)

Figure 11A:
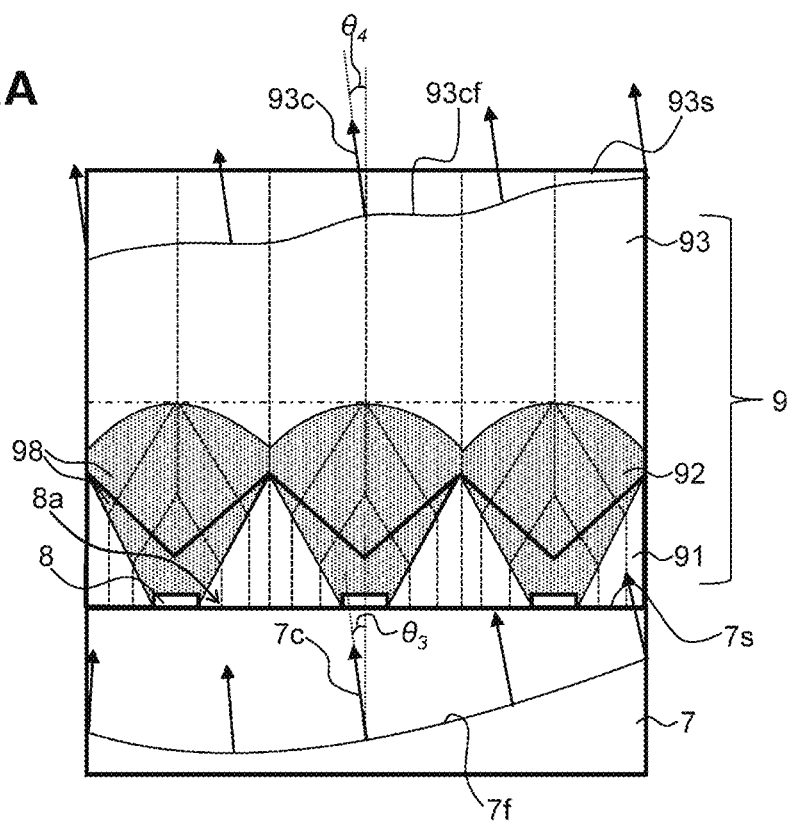
FIGS. 11A to 11B are schematic cross-sectional views showing a part of a method for manufacturing a nitride semiconductor substrate according to an embodiment of the present invention.

As shown in FIG. 10C, after the facet 92$ff$ of the c-face enlarged layer 92 completely disappears, as shown in FIG. 11A, the c-face growth layer 93 of the semiconductor layer 9 is grown on the c-face enlarged layer 92 in the normal direction (thickness direction) of the main surface, with the c-face 93$cf$ as the growth surface.

At this time, since the c-face growth layer 93 is grown with only the c-face 93$cf$ as the growth surface without exposing the facets other than the c-face 93$cf$, the incorporation of the oxygen into the c-face growth layer 93 can be suppressed. That is, the oxygen concentration in the c-face growth layer 93 can be lower than the oxygen concentration in the high oxygen concentration layer 98.

Further, at this time, the c-face growth layer 93 can be grown with reduced stress, by the stress cancelling effect of the high oxygen concentration layer 98. Thereby, it is possible to relax the degree of curvature of the c-face 93$cf$ in the c-face growth layer 93. That is, the radius of curvature of the c-face 93$cf$ in the c-face growth layer 93 can be larger than the radius of curvature of the c-face 7$f$ in the base substrate 7.

Further, at this time, since the direction dependence is caused in the stress canceling effect by the high oxygen concentration layer 98 due to the thickness distribution of the high oxygen concentration layer 98, direction dependence can be caused in the degree of curvature of the c-face 93$cf$ in the c-face growth layer 93. That is, in the c-face growth layer 93, the radius of curvature of at least a part of the c-face 93$cf$ in the direction along the m-axis can be different from the radius of curvature of the c-face 93$cf$ in the direction along the a-axis.

In this embodiment, for example, the c-face 93$cf$ of the c-face growth layer 93 in the direction along the a-axis is formed by curved in a concave spherical shape with respect to the main surface 93$s$, and meanwhile, the c-face 93$cf$ of the c-face growth layer 93 in the direction along the m-axis has convex portions and concave portions alternately formed in the direction along the m-axis. For example, the convex portions and the concave portions of the c-face 93$cf$ in the direction along the m-axis may or may not overlap the mask layer 8 and the opening 8$a$ in a plan view respectively. Further, for example, the period of the c-face 93$cf$ in the direction along the m-axis may or may not coincide with the pitch of the mask layer 8.

Further, in this embodiment, for example, in the stress canceling effects by the high oxygen concentration layer 98, the effect in the direction along the m-axis is more improved than the effect in the direction along the a-axis. Therefore, in the c-face growth layer 93, the radius of curvature of at least a part of the c-face 93$cf$ in the direction along the m-axis can be larger than the radius of curvature of the c-face 93$cf$ in the direction along the a-axis.

At this time, the off-angle $\theta_4$ of the c-face growth layer 93 may be varied from the off-angle $\theta_3$ of the base substrate 7, due to the direction dependence of the stress canceling effect by the high oxygen concentration layer 98.

The stress canceling effect by the high oxygen concentration layer 98 as described above can be adjusted as follows, for example.

For example, in the c-face enlarging step S224, it is possible to strengthen the stress expanding the c-face outward in the creeping surface direction in the high oxygen concentration layer 98, as the thickness of the high oxygen concentration layer 98 is increased. That is, the stress canceling effect by the high oxygen concentration layer 98 can be strengthened. Thereby, it is possible to improve the relaxation of the degree of curvature of the c-face 93$cf$ in the c-face growth layer 93. As a result, it is possible to increase the ratio of the radius of curvature of the c-face 93$cf$ in the c-face growth layer 93 with respect to the radius of curvature of the c-face 7$f$ in the base substrate 7.

Further, for example, since the pitch p of each of the stripe-shaped mask layer 8 is increased, it is possible to increase the height of the substantially triangular pillar-shaped three-dimensional growth layer 91 formed in the three-dimensional growth step S222. Thereby, it is possible to increase a fluctuation range (variation range) obtained by the maximum value− the minimum value in the periodic thickness of the high oxygen concentration layer 98 formed in the three-dimensional growth step S222 and the c-face enlarging step S224. Since the fluctuation range of the thickness of the high oxygen concentration layer 98 is increased, it is possible to strengthen the direction dependence of the stress canceling effect by the high oxygen concentration layer 98. As a result, in the c-face growth layer 93, it is possible to increase the ratio of the radius of curvature of at least a part of the c-face 93$cf$ in the direction along the m-axis with respect to the radius of curvature of the c-face 93$cf$ in the direction along the a-axis.

In addition, in the c-face growth step S226, the growth temperature is maintained at a temperature equal to the growth temperature in the three-dimensional growth step S222 and the growth temperature in the c-face enlarging step S224. For example, other growth conditions (excluding dope conditions described later) in the c-face growth step S226 are also maintained at the same conditions as the gas supply condition in the three-dimensional growth step S222 and other growth conditions in the c-face enlarging step S224. Since the growth conditions are maintained in this way, the c-face growth layer 93 having good crystallinity can be grown.

In the c-face growth step S226, a Si-doped GaN layer is grown as the c-face growth layer 93, by supplying GaCl gas, NH$_3$ gas and SiH$_2$Cl$_2$ gas as n-type dopant gases to the base substrate 7 heated to a predetermined growth temperature. GeCl$_4$ gas or the like may be supplied as the n-type dopant gas, instead of the SiH$_2$Cl$_2$ gas.

Further, in the c-face growth step S226, the thickness of the c-face growth layer 93 is, for example, 300 μm or more and 10 mm or less. Since the thickness of the c-face growth layer 93 is 300 μm or more, at least one substrate 10 can be sliced from the c-face growth layer 93 in the slicing step S230 described later. Meanwhile, since the thickness of the c-face growth layer 93 is 10 mm or less, at least ten substrates 10 can be obtained even in consideration of kerf loss of about 200 μm when 700 μm thick substrate 10 is sliced from the c-face growth layer 93 so as to be a final thickness of 650

(S230: Slicing Step)

Figure 11B:
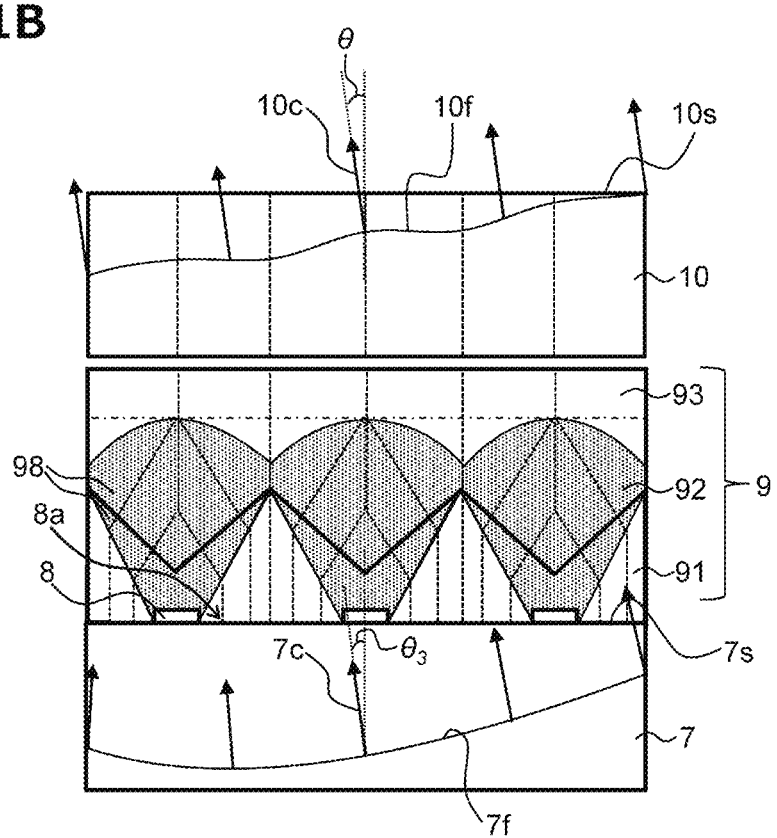

Next, as shown in FIG. 11B, for example, the c-face growth layer 93 in the semiconductor layer 9 is sliced by guiding a wire saw to a cut surface substantially parallel to the main surface 93s of the semiconductor layer 9. Thereby, the substrate 10 as an as-sliced substrate is formed. At this time, the thickness of the substrate 10 is, for example, 300 μm or more and 700 μm or less.

(S240: Polishing Step)

Next, both surfaces of the substrate 10 are polished by the polishing apparatus. At this time, the final thickness of the substrate 10 is, for example, 250 μm or more and 650 μm or less.

The substrate 10 according to this embodiment is manufactured by the above-described nitride semiconductor substrate manufacturing step S200.

In the substrate 10 according to this embodiment, the c-face 10f of the substrate 10 in the direction along the a-axis is, for example, curved in a concave spherical shape with respect to the main surface 10s. Meanwhile, the c-face 10f of the substrate 10 in the direction along the m-axis, has for example convex portions and concave portions alternately arranged in the direction along the m-axis.

Further, in the substrate 10 according to this embodiment, the radius of curvature of the c-face 10f in one of the direction along the m-axis and the direction along the a-axis, is different for example from the radius of curvature of at least a part of the c-face 10f in the other direction. In this embodiment, for example, the radius of curvature of at least a part of the c-face 10f in the direction along the m-axis is larger than the radius of curvature of the c-face 10f in the direction along the a-axis.

Further, in the substrate 10 of this embodiment, the radius of curvature of the c-face 10f is larger than the radius of curvature of the c-face 7f of the base substrate 7. Specifically, the radius of curvature of the c-face 10f of the substrate 10 is, for example, 10 m or more.

(S320: Off Angle Measuring Step)

After manufacturing the substrate 10, the off-angle ($\theta_m$, $\theta_a$) is measured at a plurality of points on the main surface 10s of the substrate 10 by a rocking curve measurement of X-ray diffraction. At this time, it is preferable to measure the off-angle ($\theta_m$, $\theta_a$) at five or more points on the main surface 10s of the substrate 10, from a viewpoint of accurate measurement. At this time, more than 5 measuring points preferably include, for example, center O, two points in the vicinity of both ends in the direction along the m-axis, and two points in the vicinity of both ends in the direction along the a-axis. Further, in order to grasp the periodicity of the c-face 10f in the direction perpendicular to the extending direction of the mask layer 8, that is, in the direction along the m-axis, it is preferable that the number of measuring points in the direction along the m-axis be not less than the number of measuring points in the direction along the a-axis.

(S340: Substrate Sorting Step)

After obtaining the off-angle of the substrate 10, the manufacturer who manufactured the substrate 10 sorts the substrates 10 by ranking, for example, based on the ratio of the area of the region where the off-angle ($\theta_m$, $\theta_a$) satisfies a predetermined condition in the main surface 10s of the substrate 10 with respect to the total area of the main surface 10s.

Specifically, when the ratio of the area of the region where the off-angle ($\theta_w$, $\theta_a$) satisfies the above formula (1) based on the total area of the main surface 10s of the substrate 10 is a predetermined value or more, the substrate 10 is ranked as a good product.

Alternatively, when the ratio of the area of the region where the off-angle ($\theta_w$, $\theta_a$) satisfies the above formulas (2-1) and (2-2) based on the total area of the main surface 10s of the substrate 10 is a predetermined value or more, the substrate 10 is ranked as a good product.

Alternatively, when the ratio of the area of the region where the off-angle ($\theta_w$, $\theta_a$) satisfies the above formulas (3-1) and (3-2) based on the total area of the main surface 10s of the substrate 10 is a predetermined value or more, the substrate 10 is ranked as a good product.

At this time, the higher the proportion of these areas, the higher the rank is. For example, when the proportion of the area is more than 50% and less than 80%, the rank of the good product is given, and when the proportion of the area is 80% or more and 100% or less, the rank of a best product is given. Further, when the proportion of the area is, for example, 10% or less, the substrate 10 is ranked as a defective product and prohibited from being shipped. A relationship between the proportion of the area and the rank can be appropriately set.

Further, after ranking the substrate 10, the substrate 10 is set as a shipping target in correspondence with a price for the substrate 10 for each predetermined rank, in a case when the substrate 10 is not a defective product. At this time, as the rank of the substrate 10 is higher, a higher price is set, but the price can be appropriately set.

(S400: Semiconductor Laminate Manufacturing Step)

Next, a semiconductor functional layer 50 containing a group III nitride semiconductor is epitaxially grown on the substrate 10, and a semiconductor laminate 30 is manufactured. In this embodiment, for example, a laminate constituting SBD is manufactured as the semiconductor laminate 30.

Figure 12A:
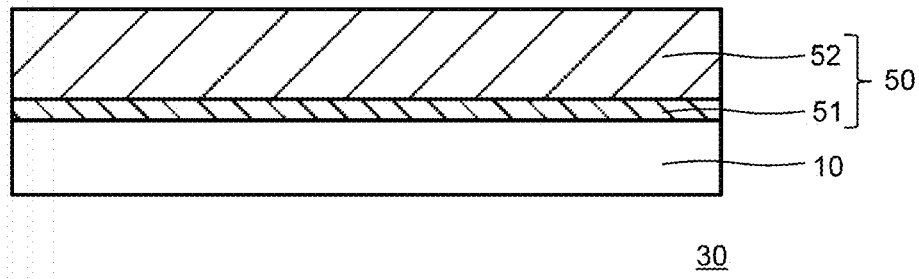
FIG. 12A to FIG. 12C are schematic cross-sectional views showing a part of a method for manufacturing a semiconductor device according to an embodiment of the present invention.

Specifically, as shown in FIG. 12A, first, for example, an n-type GaN layer as a base n-type semiconductor layer 51 is formed on the substrate 10, by supplying TMG gas, NH$_3$ and n-type dopant gas to the substrate 10 heated to a predetermined growth temperature by a MOVPE method. At this time, the n-type impurity in the base n-type semiconductor layer 51 is, for example, Si or Ge. Further, the n-type impurity concentration in the base n-type semiconductor layer 51 is equal to the n-type impurity concentration in the substrate 10, and it is $1.0 \times 10^{18}$ cm$^{-3}$ or more and $1.0 \times 10^{19}$ cm$^{-3}$ or less. Further, the thickness of the base n-type semiconductor layer 51 is 0.1 μm or more and 3 μm or less.

After forming the base n-type semiconductor layer 51, an n$^-$-type GaN layer as the drift layer 52 is formed on the base n-type semiconductor layer 51. At this time, the n-type impurity in the drift layer 52 is, for example, Si or Ge. Further, the concentration of the n-type impurity in the drift layer 52 is lower than the concentration of the n-type impurity in the substrate 10 and the concentration of the n-type impurity in the base n-type semiconductor layer 51, and it is $1.0 \times 10^{15}$ cm$^{-3}$ or more and $5.0 \times 10^{16}$ cm$^{-3}$ or less. Further, the thickness of the drift layer 52 is thicker than the thickness of the base n-type semiconductor layer 51, and it is 3 μm or more and 40 μm or less. Thus, ON resistance of the semiconductor device 40 described later can be reduced, and a withstand voltage of the semiconductor device 40 can be secured.

As described above, the semiconductor laminate 30 according to this embodiment is manufactured.

In the semiconductor laminate 30 according to this embodiment, for example, when the proportion of the area of the region where the off-angle ($\theta_w$, $\theta_a$) satisfies the formulas (2-1) and (2-2), based on the total main surface of the substrate 10, is more than 50% and preferably 80% or more, the ratio of the area of the region where an arithmetic average roughness Ra of the main surface of the semiconductor functional layer 50 is 30 nm or less and preferably 10 nm or less, based on the total area of the main surface of the semiconductor functional layer 50, is more than 50% and preferably 80% or more.

Alternatively, in the semiconductor laminate 30 according to this embodiment, for example, when the proportion of the area of the region where the off-angle ($\theta_m$, $\theta_a$) satisfies the formulas (3-1) and (3-2) based on the total main surface of the substrate 10, is more than 50% and preferably 80% or more, the proportion of the area of the region where an arithmetic average roughness Ra of the main surface of the semiconductor functional layer 50 is 30 nm or less and preferably 10 nm or less based on the total area of the main surface of the semiconductor functional layer 50, is more than 50% and preferably 80% or more.

(S500: Semiconductor Device Manufacturing Step)

Next, for example, on the user side provided with the semiconductor laminate 30, the semiconductor device 40 is manufactured using the semiconductor laminate 30.

Figure 12B:
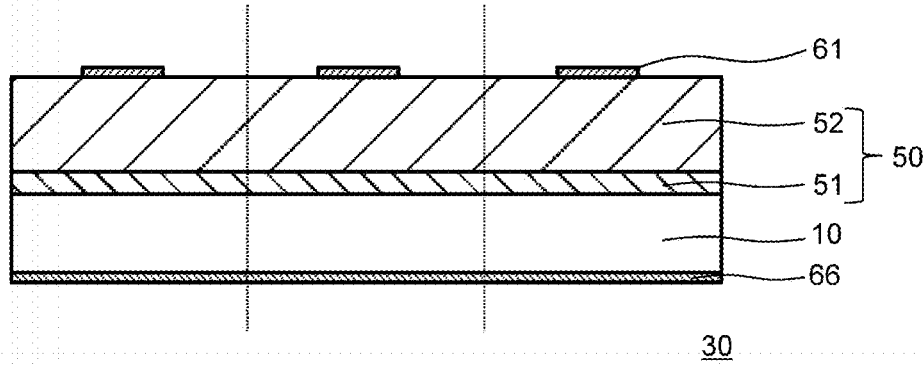
Figure 12C:
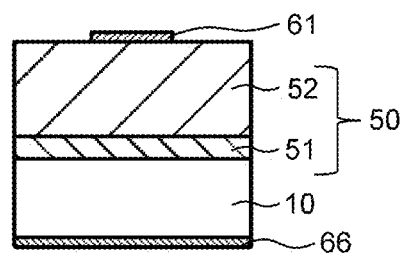

Specifically, as shown in FIG. 12B, a p-type electrode 61 is formed at a predetermined position on the drift layer 52. At this time, the p-type electrode 61 is, for example, a palladium (Pd)/nickel (Ni) film.

Further, an n-type electrode 66 is formed on the back side of the substrate 10. At this time, the n-type electrode 66 is, for example, a Ti/aluminum (Al) film.

After forming the p-type electrode 61 and the n-type electrode 66, infrared rays are irradiated to the semiconductor laminate 30 in an inert gas atmosphere to anneal the semiconductor laminate 30. Thereby, the adhesiveness of each of the p-type electrode 61 and the n-type electrode 66 is improved, and a contact resistance of each of the p-type electrode 61 and the n-type electrode 66 is reduced.

After annealing the semiconductor laminate 30, the semiconductor laminate 30 is diced and a chip of a predetermined size is cut out.

As described above, as shown in FIG. 12C, the semiconductor device 40 according to this embodiment is manufactured.

(S600: Semiconductor Device Sorting Step)

After manufacturing the semiconductor device 40, a semiconductor device sorting step S600 is performed, which is the step of sorting the semiconductor device 40 based on the off-angle ($\theta_m$, $\theta_a$) at a position (x, y) in the main surface 10s of the substrate 10. For example, when the off-angle ($\theta_m$, $\theta_a$) satisfies a predetermined condition at a predetermined position (x, y) in the main surface 10s of the substrate 10, the semiconductor device 40 is selectively picked up at the predetermined position.

Specifically, in the semiconductor device 40 cut out from the region in which the off-angle ($\theta_m$, $\theta_a$) satisfies the formula (1) in the main surface 10s of the actual substrate 10, it is determined that the surface morphology of the semiconductor functional layer 50 is possibly good, and the semiconductor device 40 is selectively picked up as a good product.

Further, in the semiconductor device 40 cut out from the region in which the off-angle ($\theta_m$, $\theta_a$) satisfies the formulas (2-1) and (2-2) in the main surface 10s of the actual substrate 10, it is determined that the surface morphology of the semiconductor functional layer 50 is surely good, and the semiconductor device 40 is selectively picked up as a best product.

Further, in the semiconductor device 40 cut out from the region in which the off-angle ($\theta_m$, $\theta_a$) satisfies the formulas (3-1) and (3-2) in the main surface 10s of the actual substrate 10, it is determined that the surface morphology of the semiconductor functional layer 50 is surely good, and the semiconductor device 40 is selectively picked up as a best product.

Meanwhile, in the semiconductor device 40 cut out from the region in which the off-angle ($\theta_m$, $\theta_a$) does not satisfy the above conditions in the main surface 10s of the actual substrate 10, it is determined that the surface morphology of the semiconductor functional layer 50 is rough and the semiconductor device 40 is excluded as a defective product.

As described above, the semiconductor device 40 as the SBD of this embodiment is manufactured.

(3) Effects Obtained by this Embodiment

According to this embodiment, one or more of the following effects can be obtained.

(a) In the semiconductor layer growth step S220 of this embodiment, oxygen is incorporated through the facets 91ff and 92ff into the portion of the semiconductor layer 9 laterally grown with facets 91ff and 92ff as growth surfaces, and the high oxygen concentration layer 98 having a higher oxygen concentration than the other portions is formed in the semiconductor layer 9. Since the oxygen is incorporated into the high oxygen concentration layer 98, the lattice constant of the high oxygen concentration layer 98 can be larger than the lattice constant of the other portions of the semiconductor layer 9. Since the lattice constant of the high oxygen concentration layer 98 is relatively larger, it is possible to generate a stress expanding the c-face outward in the creeping surface direction in the high oxygen concentration layer 98. Thereby, the stress concentrating toward the center of curvature of the c-face on the lower side of the high oxygen concentration layer 98 and the stress expanding the c-face of the high oxygen concentration layer 98 outward in the creeping surface direction, can be cancel each other. Thereafter, when the c-face growth layer 93 of the semiconductor layer 9 is grown on the high oxygen concentration layer 98 in the normal direction of the main surface, the c-face growth layer 93 can be grown with reduced stress due to the stress cancelling effect by the high oxygen concentration layer 98. Thereby, it is possible to relax the degree of curvature of the c-face 93cf in the c-face growth layer 93. As a result, the radius of curvature of the c-face 10f of the substrate 10 obtained from the c-face growth layer 93 of the semiconductor layer 9 can be larger than the radius of curvature of the c-face 7f in the base substrate 7.

(b) Since the radius of curvature of the c-face 10f of the substrate 10 being obtained from the c-face growth layer 93 of the semiconductor layer 9 is increased, the off-angle distribution (variation in the off-angle) in the main surface 10s of the substrate 10 can be narrowed within a predetermined range. Thereby, when the semiconductor functional layer 50 is grown on the substrate 10 to manufacture the semiconductor laminate 30, it is possible to easily control the surface morphology of the semiconductor functional layer 50, which depends on the off-angle in the main surface 10s of the substrate 10. For example, when the off-angle ($\theta_w$, $\theta_a$) at the center O of the main surface 10s is within a good surface morphology region, it is possible to easily obtain a portion having a good surface morphology of the semiconductor functional layer over a wide range within the main surface 10s of the substrate 10.

(c) Since the c-face growth layer 93 of the semiconductor layer 9 is grown with the stress reduced by the above method, it is possible to increase the radius of curvature of the c-face 93cf of the c-face growth layer 93 in a short time.

Here, in the case that the semiconductor layer is grown thickly (without forming a mask layer) on the base substrate having a concave spherically curved c-face, the radius of curvature of the c-face of the semiconductor layer is liable to be gradually increased, as the semiconductor layer becomes thicker. However, the rate at which the radius of curvature of the c-face becomes larger with respect to the thickness of the semiconductor layer is slow. Therefore, a long growth time is required for increasing the radius of curvature of the c-face of the semiconductor layer to a desired radius.

In contrast, in this embodiment, since the stress cancelling effect by the high oxygen concentration layer 98 described above is utilized, the radius of curvature of the c-face 93cf of the c-face growth layer 93 can be increased, regardless of the dependence of the radius of curvature of the c-face on the thickness of the semiconductor layer 9. Thereby, it is possible to increase the radius of curvature of the c-face 93cf of the c-face growth layer 93 in a short time. As a result, it is possible to improve a throughput related to the manufacture of the substrate 10 in which the radius of curvature of the c-face 10f is increased.

(d) Since the opening 8a of the mask layer 8 is formed into a stripe shape extending along one of the direction along the m-axis and the direction along the a-axis, the thickness distribution of the high oxygen concentration layer 98 can be made into a stripe-shaped distribution following the shape of the opening 8a of the mask layer 8. That is, the high oxygen concentration layer 98 can be formed, alternately having a thick portion and a thin portion in the direction perpendicular to the extending direction of the mask layer 8, in a so-called bellows shape. Thereby, it is possible to cause direction dependence in the stress canceling effect by the high oxygen concentration layer 98. Direction dependence can be caused in the degree of curvature of the c-face 93cf in the c-face growth layer 93, due to the direction dependence of the stress canceling effect by the high oxygen concentration layer 98. As a result, in the substrate 10 obtained from the c-face growth layer 93, the radius of curvature of the c-face 10f in one of the direction along the m-axis and the direction along the a-axis, can be different from the radius of curvature of at least a part of the c-face 10f in the other direction.

(e) Since the opening 8a of the mask layer 8 is formed into a stripe shape extending in the direction along the a-axis, the high oxygen concentration layer 98 can be formed, alternately having a thick portion and a thin portion in the direction along the m-axis, in a so-called bellows shape. Thereby, in the stress cancelling effects by the high oxygen concentration layer 98, the effect in the direction along the a-axis is uniform in this direction, and meanwhile the effect in the direction along the m-axis is periodic in this direction and can be improved more than the effect in the direction along the a-axis. As a result, in the substrate 10 obtained from the c-face growth layer 93, the radius of curvature of at least a part of the c-face 10f in the direction along the m-axis can be larger than the radius of curvature of the c-face 10f in the direction along the a-axis.

(f) In the substrate 10 obtained from the c-face growth layer 93, since the radius of curvature of at least a part of the c-face 10f in the direction along the m-axis is different from the radius of curvature of the c-face 10f in the direction along the a-axis, the range of the off-angle m-axis component $\theta_m$ can be different from the range of the off-angle a-axis component $\theta_a$ in the off-angle distribution of the substrate 10. Thereby, the off-angle distribution of the substrate 10 can be easily adjusted so as to correspond to a complicated distribution of the good surface morphology region in the off-angle coordinate map.

Here, as shown in FIG. 2, it is found by the inventors of the present invention, that in the dependence of the surface morphology of the semiconductor functional layer on the off-angle of the main surface of the substrate, the good surface morphology region is not necessarily centrally symmetric with respect to the off-angle (0, 0), but shows a complicated distribution. It can be considered that this is because the surface morphology of the semiconductor functional layer is influenced by not only the off-angle of the substrate, but also a state of a growth furnace during growth of the semiconductor functional layer, how to place the substrate, a rotating direction of the substrate, a supply direction of gas to the substrate, etc. Since such a dependence of the surface morphology is shown, it becomes difficult to widen the good surface morphology region in the main surface of the substrate, when the off-angle distribution of the substrate is isotropic (that is, the range of the main surface of the substrate is a true circle on the off-angle coordinate map).

Therefore, in this embodiment, since the radius of curvature of at least a part of the c-face 10f in the direction along the m-axis, is different from the radius of curvature of the c-face 10f in the direction along the a-axis, the range of the off-angle m-axis component $\theta_m$ can be different from the range of the off-angle a-axis component $\theta_a$ in the off-angle distribution of the substrate 10, that is, the off-angle distribution of the substrate 10 can be anisotropic. Thereby, it is possible to easily adjust the off-angle distribution in the main surface 10s of the substrate 10, so as to correspond to the complicated distribution of the good surface morphology region on the off-angle coordinate map. As a result, the portion where the surface morphology of the semiconductor functional layer is good can be widened efficiently in the main surface 10s of the substrate 10.

(g) In the substrate 10 obtained from the c-face growth layer 93, since the radius of curvature of at least a part of the c-face 10f in the direction along the m-axis is larger than the radius of curvature of the c-face 10f in the direction along the a-axis, the range of the off-angle m-axis component $\theta_m$ can be smaller than the range of the off-angle a-axis component $\theta_a$ in the off-angle distribution of the substrate 10. Here, in the good surface morphology region of the off-angle coordinate map described above, there are many regions that are short in the $\theta_m$ axis direction and long in the $\theta_a$ axis direction. Therefore, in this embodiment, since the range of the off-angle m-axis component $\theta_m$ is smaller than the range of the off-angle a-axis component $\theta_a$ in the off-angle distribution of the substrate 10, the off-angle distribution of the substrate 10 can be easily adjusted so as to correspond to the region that is short in the $\theta_m$ axis direction and long in the $\theta_a$ axis direction in the good surface morphology region. As a result, the portion where the surface morphology of the semiconductor layer is good can be widened more efficiently in the main surface 10s of the substrate 10.

(h) Further, in the substrate 10 obtained from the c-face growth layer 93, since the radius of curvature of at least a part of the c-face 10f in the direction along the m-axis, is 1.5 times or more, preferably 2 times or more the radius of curvature of the c-face 10f along the a-axis, the range of the off-angle m-axis component $\theta_m$ can be ⅔ or less, preferably ½ times or less of the range of the off-angle a-axis component $\theta_a$. Thereby, the off-angle distribution of the substrate 10 can be stably maintained in the good surface morphology region. As a result, the portion where the surface morphology of the semiconductor layer is good can be widened more efficiently and easily in the main surface 10s of the substrate 10.

(i) The off-angle ($\theta_m$, $\theta_a$) in at least a part of the main surface 10s of the substrate 10 of this embodiment is included in at least any one of the region A, the region B, and the region C. Thereby, the portion where the surface morphology of the semiconductor functional layer 50 is good can be obtained from at least a part of the semiconductor laminate 30 in which the substrate 10 is used. Since the semiconductor device 40 is fabricated from the portion where the surface morphology of the semiconductor functional layer 50 is good, it is possible to suppress local electric field concentration on the surface of the semiconductor functional layer 50. As a result, the withstand voltage of the semiconductor device 40 can be improved.

(j) In the nitride semiconductor substrate manufacturing step S200 of this embodiment, a substrate fabricated by the VAS method is used as the base substrate 7. The dislocation density is low in the base substrate 7 fabricated by the VAS method. Since the semiconductor layer 9 is grown on the main surface 7s of the base substrate 7, with the stripe-shaped mask layer 8 formed thereon, a part of the plurality of dislocations extending in the direction along the c-axis in the base substrate 7, is blocked by the mask layer 8, and propagation to the semiconductor layer 9 is suppressed. Further, since the dislocations are locally collected during the growth process of the semiconductor layer 9, the dislocations having the Burgers vector conflict each other can disappear, out of the collected plurality of dislocations. Thereby, the dislocation density in the main surface of the semiconductor layer 9 can be reduced. As a result, it is possible to obtain the substrate 10 whose dislocation density is further reduced than that of the base substrate 7.

(k) In the semiconductor layer growth step S220 of this embodiment, the dislocations propagating in the direction along the c-axis of the three-dimensional growth layer 91 can bend and propagate in a direction substantially perpendicular to the facet 91f, that is, in a direction inclined with respect to the c-axis, at a position where the facet 91f other than the c-face 91cf is exposed. Thereby, the low dislocation density region can be formed on the upper side of the portion where the dislocations propagated in the direction inclined with respect to the c-axis. Since the semiconductor device is cut out from the low dislocation density region of the substrate 10 manufactured in this manner, it is possible to obtain a semiconductor device in which deterioration of device characteristics caused by dislocations is suppressed.

(l) In this embodiment, a plurality of dislocations are less likely to combine (mix) during growth of the semiconductor layer 9 on the base substrate 7, due to low dislocation density in the main surface of the base substrate 7 used in the above-described manufacturing method. Thereby, generation of the dislocations having a large Burgers vector can be suppressed in the substrate 10 obtained from the semiconductor layer 9. Specifically, the size of each Burgers vector of the plurality of dislocations included in the substrate 10 can be, for example, any one of a, a+c, or c. As a result, in the semiconductor device cut out from the substrate 10, it is possible to suppress deterioration of device characteristics due to dislocation having a large Burgers vector.

Other Embodiments

As described above, embodiments of the present invention have been specifically described. However, the present invention is not limited to the above-described embodiments, and can be variously modified in a range not departing from the gist of the invention.

In the above embodiment, explanation is given for the case that the substrate 10 is a GaN free-standing substrate. However, the substrate 10 is not limited to the GaN free-standing substrate. For example, the substrate 10 may be the free-standing substrate containing the group III nitride semiconductor such as aluminum nitride (AlN), aluminum gallium nitride (AlGaN), indium nitride (InN), indium gallium nitride (InGaN), and aluminum indium gallium nitride (AlInGaN), that is, a group III nitride semiconductor represented by a composition formula of $Al_xIn_yGa_{1-x-y}N$ ($0 \le x \le 1$, $0 \le y \le 1$, $0 \le x+y \le 1$).

In the above embodiments, explanation is given for the case that the substrate 10 is n-type. However, the substrate 10 may be p-type, or may have semi-insulating property. For example, in the case of manufacturing a semiconductor device as a high electron mobility transistor (HEMT) using the substrate 10, it is preferable that the substrate 10 has the semi-insulating property.

In the above embodiments, explanation is given for the case that the semiconductor functional layer 50 contains GaN. However, the semiconductor functional layer 50 is not limited to contain GaN, and the semiconductor functional layer 50 may contain, for example, group III nitride semiconductors such as AlN, AlGaN, InN, InGaN, and AlInGaN, that is, a group III nitride semiconductor represented by a composition formula of $Al_xIn_yGa_{1-x-y}N$ ($0 \le x \le 1$, $0 \le y \le 1$, $0 \le x+y \le 1$).

In the above embodiments, explanation is given for the case that the semiconductor functional layer 50 contains the same group III nitride semiconductor as that of the substrate 10. However, at least one of the semiconductor functional layers 50 may contain a group III nitride semiconductor different from that of the substrate 10.

In the above embodiments, explanation is given for the case that the semiconductor device 40 manufactured from the semiconductor laminate 30 is SBD. However, the semiconductor device 40 may be the one other than SBD. Specifically, the semiconductor device 40 may be, for example, a pn junction diode (including an LED), a junction barrier Schottky diode, a HEMT, or the like.

In the case that the semiconductor device 40 is a pn junction diode as an LED and the light emitting layer contains In, since the radius of curvature of the c-face 10f of the substrate 10 is increased and the off-angle distribution (variation in the off-angle) in the main surface 10s of the substrate 10 is narrowed within a predetermined range, it is possible to suppress the variation in the In content in the light emitting layer.

In the above embodiments, explanation is given for the case that the opening 8a of the mask layer 8 is formed into a stripe shape extending in the direction along the a-axis in the mask layer forming step S210. However, the following modified example 1 may also be applied.

Modified Example 1

In the Modified Example 1, the Opening 8a of the Mask Layer 8 is formed into a stripe shape extending in the direction along the m-axis in the mask layer forming step S210. In the modified example 1, the following substrate 10 can be obtained.

In the substrate 10 according to the modified example 1, the c-face 10f in the direction along the m-axis is curved, for example, in a concave spherical shape with respect to the main surface 10s. Meanwhile, the c-face 10f of the substrate 10 in the direction along the a-axis, has, for example, convex portions and concave portions alternately arranged in the direction along the a-axis.

Further, in the substrate 10 according to the modified example 1, the radius of curvature of at least a part of the c-face 10f in the direction along the a-axis is larger than, for example, the radius of curvature of the c-face 10f in the direction along the m-axis. The radius of curvature of at least a part of the c-face 10f in the direction along the a-axis is, for example, 1.5 times or more, preferably 2 times or more the radius of curvature of the c-face 10f along the m-axis.

Further, in the substrate 10 according to the modified example 1, the radius of curvature of the c-face 10f is larger than the radius of curvature of the c-face 7f of the base substrate 7. Specifically, the radius of curvature of the c-face 10f of the substrate 10 is, for example, 10 m or more.

According to the modified example 1, the off-angle distribution of the substrate 10 can be adjusted so as to correspond to the good surface morphology region in the off-angle coordinate map. Specifically, in the off-angle coordinate map, the off-angle distribution of the substrate 10 can be easily adjusted, for example, so as to correspond to the region which is short in the $\theta_a$ axis direction and long in the $\theta_m$ axis direction in the good surface morphology region.

In the above embodiments, explanation is given for the case that the base substrate 7 is fabricated by the VAS method in the base substrate preparing step S 100. However, a method other than the VAS method may be used as long as it is a method for fabricating the base substrate 7 by using a heterogeneous substrate containing a material different from that of the group III nitride semiconductor, and peeling the crystal layer from the heterogeneous substrate.

In the above embodiments, explanation is given for the case that the second crystal layer 6 is sliced using a wire saw in the slicing step S170 or the like. However, for example, an outer peripheral blade slicer, an inner peripheral blade slicer, an electric discharge machine, or the like may be used.

In the above embodiments, explanation is given for the case that in each of the c-face enlarging step S224 and the c-face growth step S226 of the semiconductor layer growth step S220, the growth condition is maintained equal to the growth condition in the three-dimensional growth step S222. However, the growth condition in at least one of the c-face enlarging step S224 and the c-face growth step S226 may be different from the growth condition in the three-dimensional growth step S222. For example, the growth condition in at least one of the c-face enlarging step S224 and the c-face growth step S226 may be the growth condition in which the growth rate in the direction along the c-axis is equal to or lower than the growth rate in the direction other than the direction along the c-axis.

In the above embodiments, explanation is given for the case that the thickness of the c-face growth layer 93 is set to a thickness such that a plurality of substrates 10 can be obtained from the c-face growth layer 93, in the c-face growth step S226. However, there is a possibility that the following problem occurs. Specifically, as the thickness of the c-face growth layer 93 is increased, the influence of the c-face growth layer 93 itself having a low lattice constant and low oxygen concentration becomes strong, and there is a possibility that the stress concentrating toward the center of curvature of the c-face 93cf is increased in the c-face growth layer 93. Therefore, when the thickness of the c-face growth layer 93 becomes excessively thick, there is a possibility that relaxation of the degree of curvature of the c-face 93cf is weakened in the upper layer portion of the c-face growth layer 93, and the warp of the c-face 93cf becomes large (the radius of curvature becomes small). Therefore, in order to solve such a problem, the following modified examples 2 and 3 may be applied.

Modified Example 2

In the modified example 2, in the c-face growth step S226, the thickness of the c-face growth layer 93 is thinner than the thickness of the substrate 10 in the above embodiment, and for example, it is 100 μm or more and 200 μm or less. Thereafter, the slicing step S230 and the polishing step S240 are not performed. That is, a laminate structure having the base substrate 7, the mask layer 8, and the semiconductor layer 9 is fabricated without obtaining the substrate 10 from the c-face growth layer 93 (The state of FIG. 11A).

After fabricating the laminate structure, the semiconductor functional layer 50 is epitaxially grown on the laminate structure, to thereby manufacture the semiconductor laminate 30 in the semiconductor manufacturing fabrication step S400. After manufacturing the semiconductor laminate 30, the back side of the laminate structure is polished, the base substrate 7, the mask layer 8, and the high oxygen concentration layer 98 are removed out of the laminate structure. Thereby, it is possible to obtain the semiconductor laminate 30 having the c-face growth layer 93 and the semiconductor functional layer 50 in the same manner as in the above embodiment. The subsequent steps are the same as those in the above embodiments.

According to the modified example 2, the growth of the c-face growth layer 93 is stopped in a state that the stress canceling effect by the high oxygen concentration layer 98 is high in the c-face growth step S226. Thereby, the degree of curvature of the c-face 93cf of the c-face growth layer 93 is reliably relaxed, and it is possible to avoid a reduction phenomenon of the radius of curvature of the c-face 93cf due to the thickening of the c-face growth layer 93.

Further, according to the modified example 2, after manufacturing the semiconductor laminate 30, the base substrate 7, the mask layer 8, and the high oxygen concentration layer 98 are removed out of the laminate structure. Therefore, the base substrate 7, the mask layer 8 and the high oxygen concentration layer 98 do not remain on the back side of the semiconductor device 40 obtained from the semiconductor laminate 30. Thereby, an electrode can be easily formed on the back side of the semiconductor device 40.

Modified Example 3

In the modified example 3, the thickness of the c-face growth layer 93 is set to a thickness such that only one substrate 10 can be obtained, and it is for example, 300 µm to 700 µm in the c-face growth step S226. Thereafter, a single substrate 10 is obtained by performing the slicing step S230 and the polishing step S240. A final thickness of the substrate 10 is, for example, 250 µm or more and 650 µm or less.

After obtaining a single substrate 10, a full-scale growth layer (bulk growth layer) is epitaxially grown on the substrate 10 with the c-face as a growth surface in a full-scale growth step, for example, by HVPE method using the substrate 10 as a seed substrate. At this time, the thickness of the full-scale growth layer is set to a thickness such that a plurality of substrates 10 can be obtained, for example, it is 300 µm or more and 10 mm or less. Thereafter, a plurality of substrates 10 are obtained by performing the slicing step and the polishing step. The final thickness of the substrate 10 is, for example, 250 µm or more and 650 µm or less in the same manner as in the above embodiments.

According to the modified example 3, the thickness of the c-face growth layer 93 is set to a thickness such that only a single substrate 10 can be obtained in the c-face growth step S226. Further, the growth of the c-face growth layer 93 is stopped in a state that the stress canceling effect by the high oxygen concentration layer 98 is high. Thereby, it is possible to avoid the reduction phenomenon of the radius of curvature of the c-face 93*cf* due to the thickening of the c-face growth layer 93, in the same manner as in the modified example 2.

Further, according to the modified example 3, the full-scale growth layer is grown in the full-scale growth step, using the substrate 10 having the relaxed degree of curvature of the c-face 93*cf* of the c-face growth layer 93 as a seed substrate. There is no special structure for adjusting the stress on the back side of the substrate 10 used as the seed substrate. Thereby, it is possible to suppress occurrence of special anisotropy in thermal deformation of the substrate 10 in the full-scale growth step. That is, the thermal deformation of the substrate 10 can be made dependent only on the linear expansion coefficient of the group III nitride semiconductor itself constituting the substrate 10. Thereby, it is possible to maintain a state in which the stress in the full-scale growth layer is reduced for a long time in the full-scale growth step. As a result, it is possible to obtain many substrates 10 with relaxed curvature of the c-face, from the full-scale growth layer.

EXAMPLES

Hereinafter, various experimental results which support the effect of the present invention will be described.

(1) Experiment 1

(1-1) Fabrication of the Laminate Structure for Manufacturing a Nitride Semiconductor Substrate
A semiconductor layer was grown on a base substrate using the method for the above embodiment, with the following conditions and configuration. Thereby a laminate structure was fabricated for manufacturing a nitride semiconductor substrate.

Figure 13:
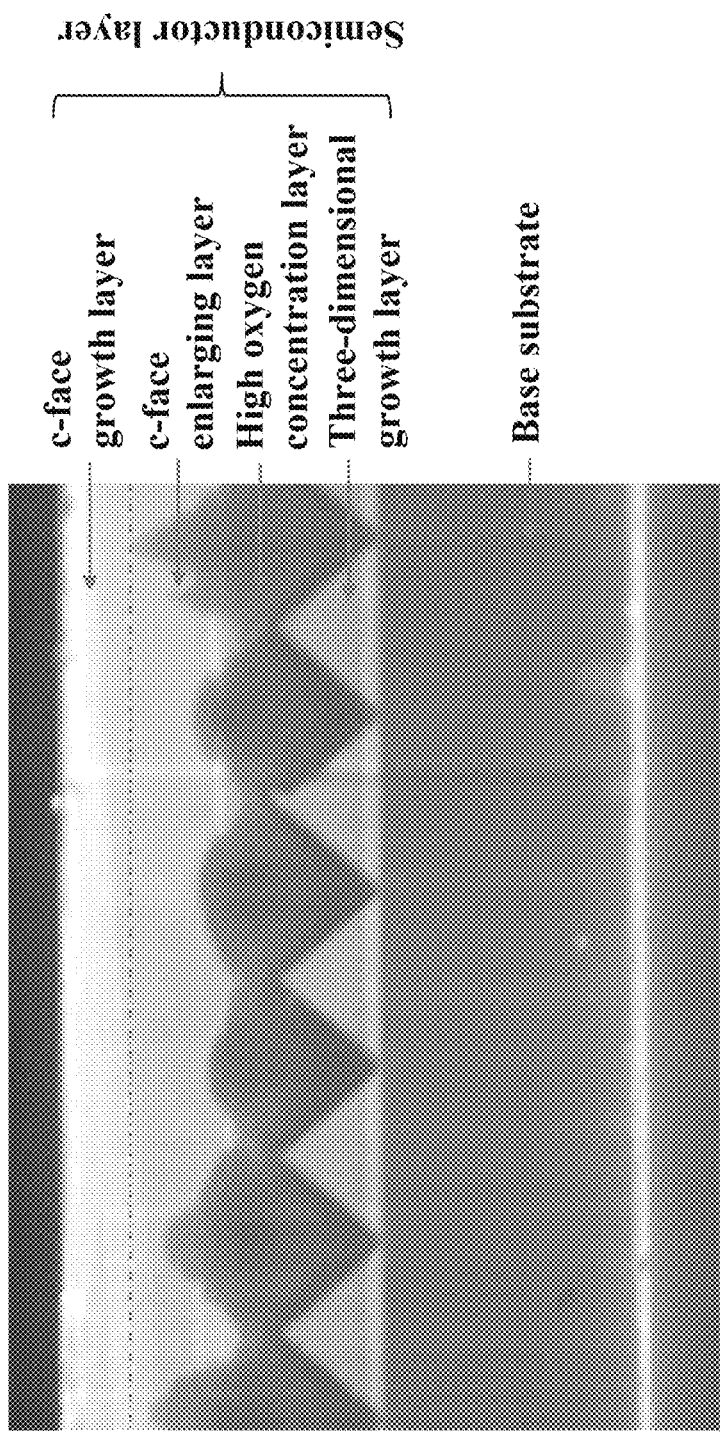
FIG. 13 is a view showing an observation image by a fluorescence microscope in a cross section including a-face of a laminate structure according to an example.

(Base substrate)
Material: GaN
Fabrication method: VAS method
Diameter: 1 inch
Thickness: 400 µm
Lowest index crystal plane nearest to the main surface: (0001) plane
(Mask Layer)
Shape of mask layer in plan view: stripe shape
Extending direction of the mask layer: a-axis direction
Thickness of the mask layer: 1 µm
Width of the mask layer: 10 µm
Pitch of the mask layer: 200 µm
(Semiconductor Layer)
Material: GaN
Film formation method: HVPE method
Thickness of the semiconductor layer: about 400 µm
GaCl gas flow rate: $NH_3$ gas flow rate=1:1
Growth temperature: 1015° C.
Growth time: 120 min
(1-2) Evaluation
(Fluorescence Microscopy Observation)
The above laminate structure was cleaved with a section including the a-face, and the cross section was observed with a fluorescence microscope.
(Observation of Cathode Luminescence Image)
A cathode luminescence (CL) image in the section including the a-face was observed using a scanning electron microscope (SEM).
(Measurement of Distribution of c-Face and Radius of Curvature)
Rocking curve measurement of X-ray diffraction was performed on the main surface of the semiconductor layer. Thereby, the distribution of the c-face of the semiconductor layer was grasped and the radius of curvature of the c-face was obtained. Similar measurement was performed on the main surface of the base substrate using the base substrate equivalent to the base substrate used in experiment 1, and the radius of curvature of the c-face of the base substrate was obtained.
(Measurement of Dislocation Density)
The above laminate structure was subjected to etching treatment by molten KOH. Then, the dislocation density (average dislocation density) on the main surface of the semiconductor layer was measured, by measuring the density of etch pits generated corresponding to the dislocations on the main surface of the semiconductor layer by microscopic observation.
(Measurement of Burgers Vector of Dislocations)
The size of the Burgers vector of dislocations in the semiconductor layer was measured, by a LACBED method using TEM.
(1-3) Result
(Observation Image by Fluorescence Microscope)
FIG. 13 is a view showing an observation image by a fluorescence microscope in a cross section including the a-face of a laminate structure according to an example.
As shown in FIG. 13, due to a difference in photoluminescence (PL) intensity, presence of each layer in the semiconductor layer was confirmed.
A plurality of substantially triangular pillar-shaped three-dimensional growth layers were formed on the base substrate so as to be adjacent to each other with the mask layer interposed therebetween. Thereby, it was confirmed that the three-dimensional growth layer was three-dimensionally grown on the base substrate exposed in the opening of the mask layer, and facets other than the c-face could be exposed. It was also confirmed that the c-face could be completely made disappear from the three-dimensional growth layer, because the top of the three-dimensional growth layer was sharp so as to be pointed. It was also confirmed that the surface parallel to the a-axis and inclined from the m-face was exposed as the facet of the three-dimensional growth layer, because the three-dimensional growth layer had an inclined surface having a substantially triangular pillar shape.

A layer with low PL intensity was formed on the three-dimensional growth layer. In this layer, it is considered that the PL intensity is low due to the high oxygen concentration. That is, it was confirmed that oxygen was incorporated into a portion where the layer was laterally grown with the facet as a growth surface, and the high oxygen concentration layer having a higher oxygen concentration than the other portions could be formed in the semiconductor layer. Further, the high oxygen concentration layer was formed so as to bury the V-shaped concave portion between the adjacent three-dimensional growth layers. The high oxygen concentration layer was also formed on the top of the three-dimensional growth layer. Thereby, the portions of the high oxygen concentration layers where the concave portions between the adjacent three-dimensional growth layers are buried, were continuously connected through the portions formed on the top of the three-dimensional growth layers. That is, it was confirmed that the high oxygen concentration layer could be formed continuously in the direction along the main surface in the semiconductor layer.

The high oxygen concentration layer gradually disappeared toward the upper side of the main surface of the base substrate, and a layer having PL intensity higher than that of the high oxygen concentration layer was again formed. Thereby, it was confirmed that the c-face was gradually enlarged toward the upper side of the main surface of the base substrate, and the c-face enlarged layer was formed.

The layer having higher PL intensity than the high oxygen concentration layer is continuously formed on the c-face enlarged layer. The main surface of the layer was a flat surface parallel to the main surface of the base substrate. Thereby, it was confirmed that the c-face growth layer having a low oxygen concentration could be grown on the high oxygen concentration layer in the normal direction of the main surface, with the c-face as a growth surface.

(CL Image)

Figure 14:
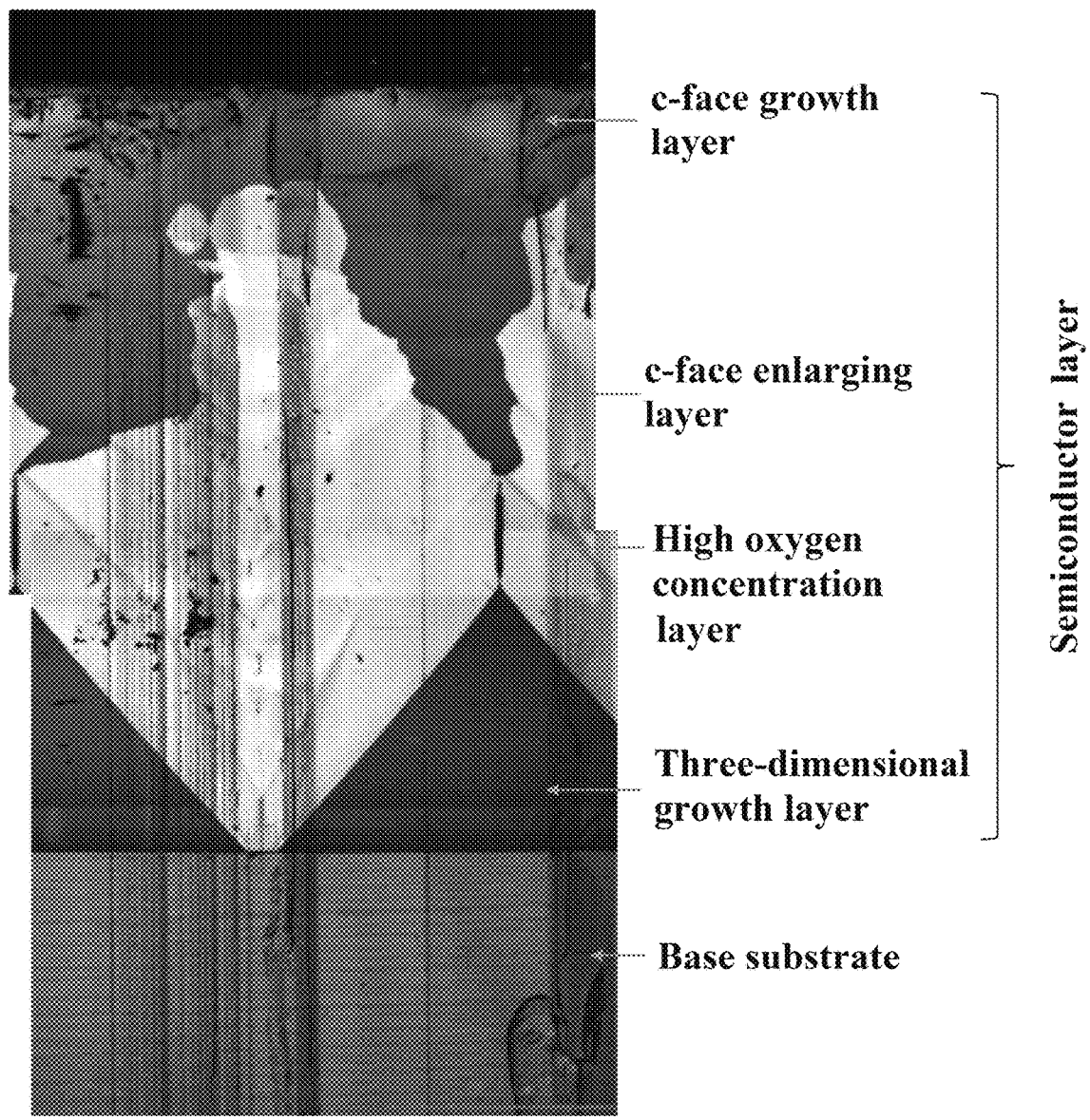
FIG. 14 is a view showing a cathode luminescence image by a scanning electron microscope in a cross section including a-face of the laminate structure according to an example.

FIG. 14 is a view showing a cathode luminescence image by a scanning electron microscope in a cross section including the a-face of the laminate structure according to an example.

As shown in FIG. 14, the presence of the three-dimensional growth layer, the high oxygen concentration layer, the c-face enlarged layer and the c-face growth layer was confirmed in the semiconductor layer of the CL image, based on the difference in the CL intensity, similarly to the observation image by the fluorescence microscope.

(Distribution of c-Face and Radius of Curvature)

Figure 15C:
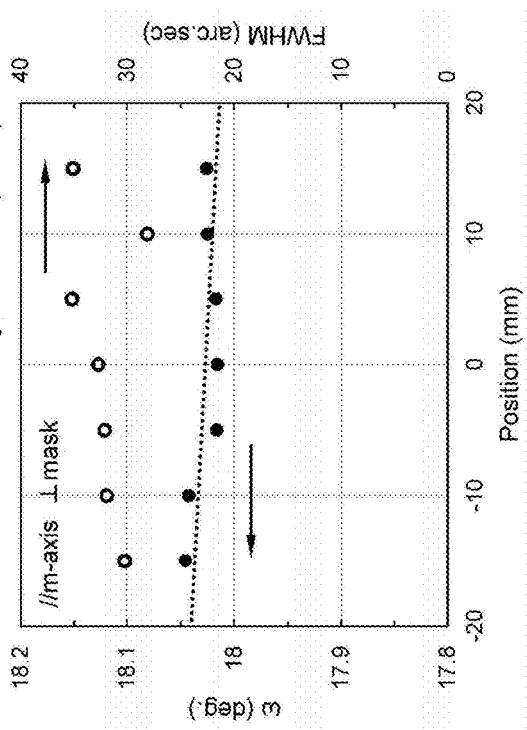
FIG. 15C is a view showing a result of rocking curve measurement of X-ray diffraction in a direction along m-axis of a semiconductor layer.
Figure 15D:
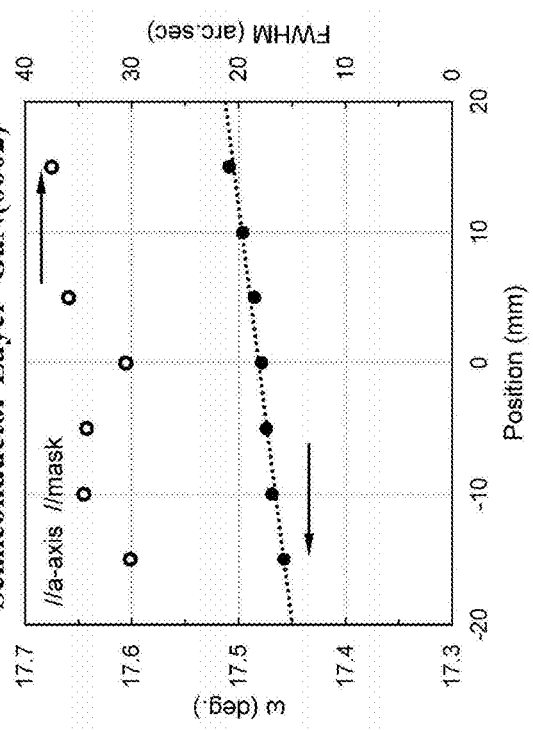
FIG. 15D is a view showing a result of rocking curve measurement of X-ray diffraction in a direction along a-axis of the semiconductor layer.
Figure 15A:
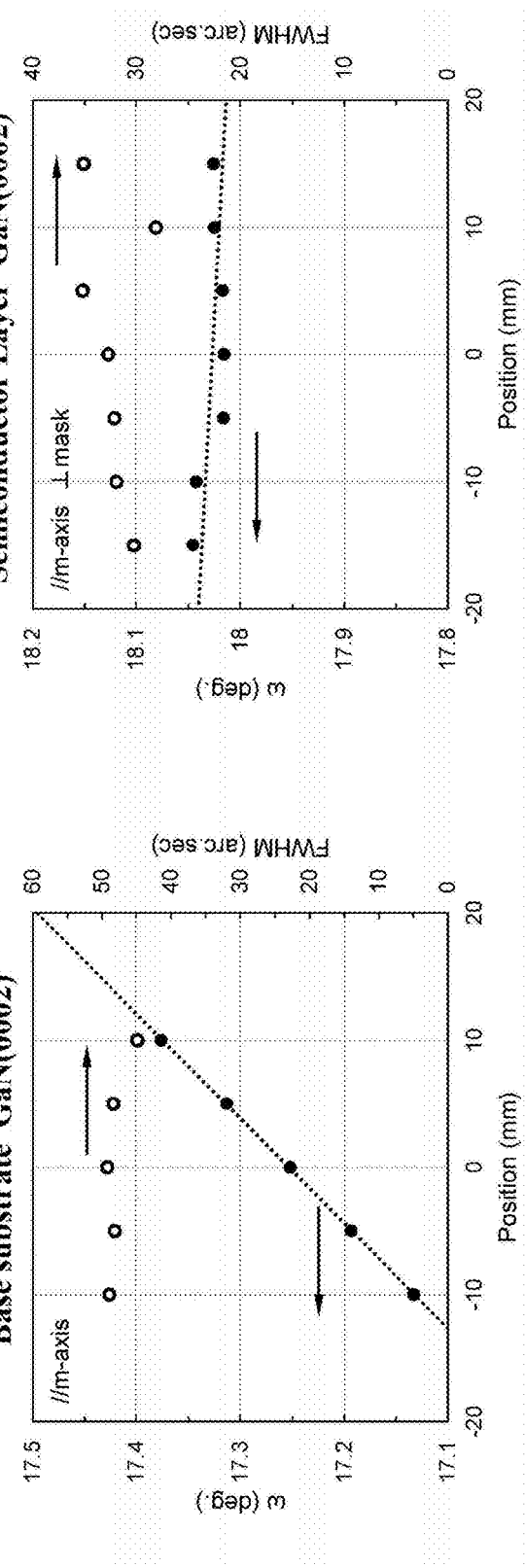
FIG. 15A is a view showing a result of rocking curve measurement of X-ray diffraction in a direction along m-axis of the base substrate.
Figure 15B:
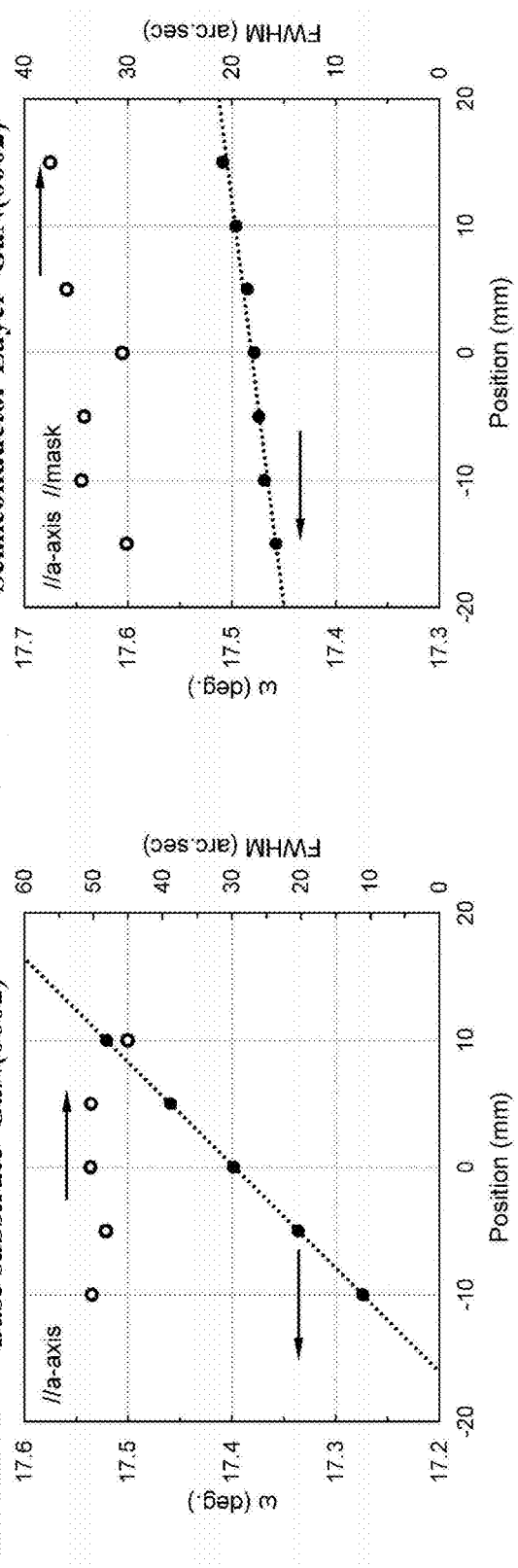
FIG. 15B is a view showing a result of rocking curve measurement of X-ray diffraction in a direction along a-axis of the base substrate.
Figure 16A:
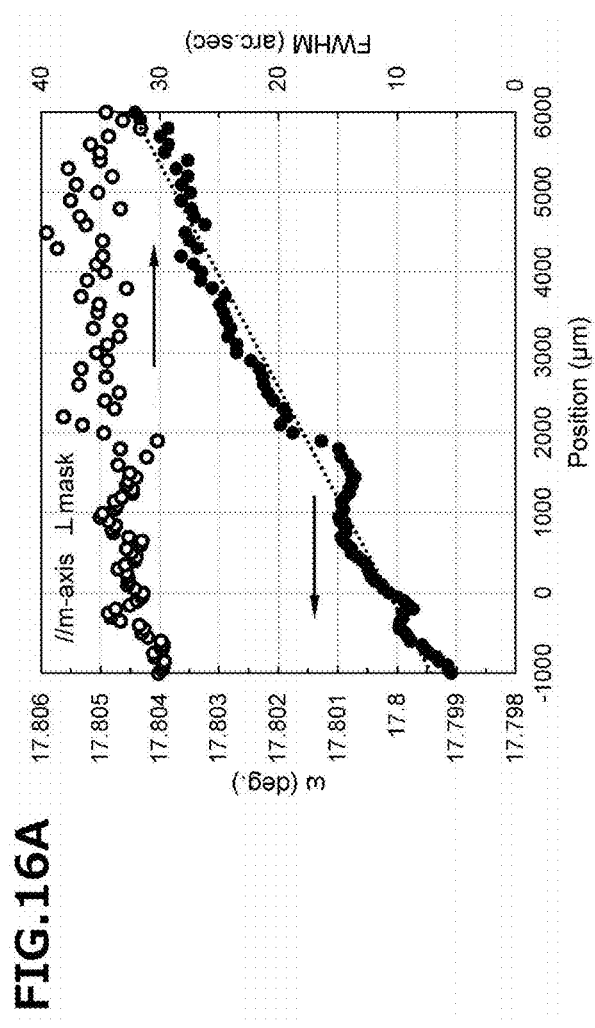
FIG. 16A is a view showing a result of rocking curve measurement of X-ray diffraction at a narrow pitch in a direction along m-axis of the semiconductor layer.
Figure 16B:
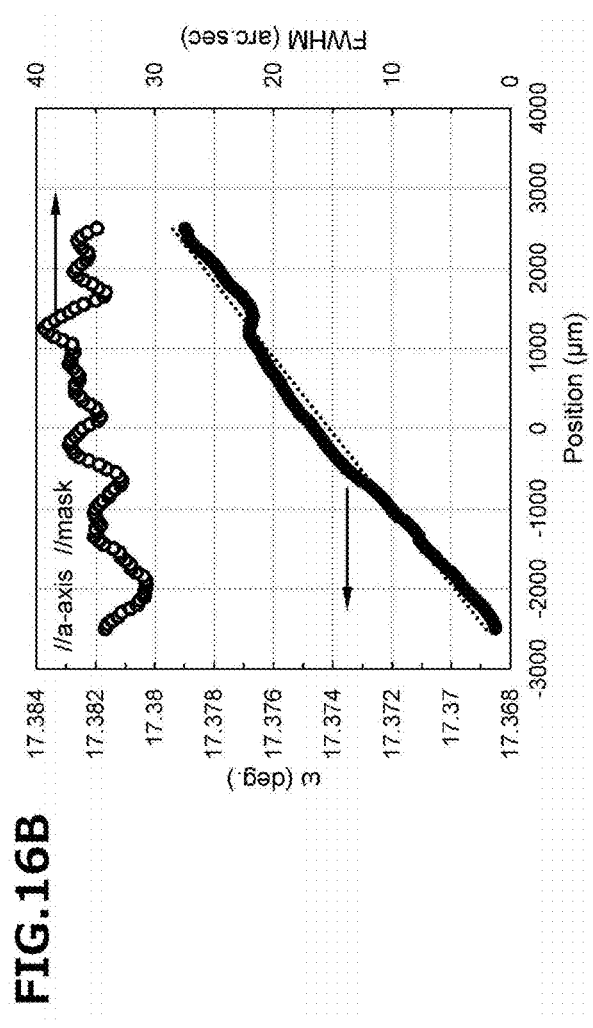
FIG. 16B is a view showing a result of rocking curve measurement of X-ray diffraction at a narrow pitch in a direction along a-axis of the semiconductor layer.

FIG. 15A is a view showing a result of rocking curve measurement of X-ray diffraction in a direction along the m-axis of the base substrate, FIG. 15B is a view showing a result of rocking curve measurement of X-ray diffraction in a direction along the a-axis of the base substrate, FIG. 15C is a view showing a result of rocking curve measurement of X-ray diffraction in a direction along the m-axis of a semiconductor layer, FIG. 15D is a view showing a result of rocking curve measurement of X-ray diffraction in a direction along the a-axis of the semiconductor layer, FIG. 16A is a view showing a result of rocking curve measurement of X-ray diffraction at a narrow pitch in a direction along the m-axis of the semiconductor layer, and FIG. 16B is a view showing a result of rocking curve measurement of X-ray diffraction at a narrow pitch in a direction along the a-axis of the semiconductor layer. In the measurements of FIGS. 16A and 16B, the slit width was 0.03 mm, and therefore an X-ray footprint was about 0.1 mm.

According to the measurement results of the base substrate in each of FIGS. 15A and 15B, a diffraction angle ω was increased linearly with respect to a position of the base substrate in each of the direction along the m-axis and the direction along the a-axis. Therefore, it was confirmed that c-face of the base substrate in each of the direction along the m-axis and the direction along the a-axis is curved in a concave spherical shape with respect to the main surface of the base substrate. Further, the radius of curvature of the c-face was obtained based on the inclination of the diffraction angle with respect to the position in the figure. Then, it was found that the radius of curvature of c-face of the base substrate in each of the direction along the m-axis and the direction along the a-axis was about 4.7 m.

According to the measurement results of the semiconductor layer in FIGS. 15C and 15D, FWHM of the semiconductor layer was smaller than FWHM of the base substrate. Therefore, it was confirmed that the semiconductor layer having good crystallinity could be grown on the base substrate.

Further, according to the macroscopic measurement result of the direction along the m-axis of the semiconductor layer in FIG. 15C, the diffraction angle ω was decreased while changing randomly with respect to the position in the direction along the m-axis of the semiconductor layer. Therefore, it was confirmed that the c-face in the direction along the m-axis of the semiconductor layer was convexly curved with respect to the main surface. Further, the radius of curvature of the c-face was obtained based on the inclination of an approximate straight line of the diffraction angle with respect to the position in the direction along the m-axis in the figure. Then, it was found that the macroscopic radius of curvature of the c-face of the semiconductor layer in the direction along the m-axis was approximately 81.9 m.

Further, according to the microscopic measurement result of the direction along the m-axis of the semiconductor layer in FIG. 16A, the diffraction angle ω with respect to the position in the direction along the m-axis of the semiconductor layer was increased while varying with a random period. Therefore, it was confirmed that in the semiconductor layer, the c-face in the direction along the m-axis had convex portions and concave portions alternately arranged in the direction along the m-axis. It was also confirmed that the c-face in the direction along the m-axis of the semiconductor layer was concavely curved with respect to the main surface within a range of 7 mm in the direction along the m-axis of the semiconductor layer. Further, the diffraction angle ω with respect to the position in the direction along the m-axis of the semiconductor layer can be approximated to a straight line. Therefore, when the radius of curvature of the c-face was obtained based on the inclination of an approximate line, the microscopic radius of curvature of the c-face in the direction along the m-axis was approximately 81.9 m within the range of 7 mm in the direction along the m-axis of the semiconductor layer.

Further, according to the macroscopic measurement result of the direction along the a-axis of the semiconductor layer of FIG. 15D, the diffraction angle ω was linearly increased with respect to the position in the direction along the a-axis of the semiconductor layer. Therefore, it was confirmed that the c-face in the direction along the a-axis of the semiconductor layer was curved in a concave spherical shape with respect to the main surface. Further, when the radius of curvature of the c-face was obtained based on the inclination of the approximate straight line of the diffraction angle with respect to the position in the direction along the a-axis in the figure, the radius of curvature of the c-face in the direction along the a-axis of the semiconductor layer was approximately 35.8 m.

Further, according to the microscopic measurement result in the direction along the a-axis of the semiconductor layer in FIG. 16B as well, the diffraction angle ω with respect to the position in the direction along the a-axis of the semiconductor layer was linearly increased. Therefore, it was confirmed that the c-face in the direction along the a-axis of the semiconductor layer had no periodicity. In the figure, the diffraction angle ω is changed stepwise at the position of 1500 μm. However, this is considered to be due to straddling the mask layer on the base substrate during measurement.

From these results, it was confirmed that the radius of curvature of the c-face in the c-face growth layer of the semiconductor layer could be larger than the radius of curvature of the c-face in the base substrate, due to the above-described stress canceling effect by the high oxygen concentration layer. It was also confirmed that since the opening of the mask layer is formed into a stripe shape extending in the direction along the a-axis, the direction dependence could be caused in the stress canceling effect by the high oxygen concentration layer, and the radius of curvature of at least a part of the c-face in the direction along the m-axis could be larger than the radius of curvature of the c-face in the direction along the a-axis.

(Dislocation Density)

The dislocation density (the maximum value) in the main surface of the semiconductor layer was $5.2 \times 10^5$ cm$^{-2}$. The dislocation density in the main surface of the base substrate was approximately $3 \times 10^6$ cm$^{-2}$. Thereby, it was confirmed that according to the manufacturing method described above, the dislocation density in the main surface of the semiconductor layer could be lower than the dislocation density in the main surface of the base substrate.

Further, the high dislocation density region and the low dislocation density region were formed in the main surface of the semiconductor layer. The dislocation density in the low dislocation density region was lower than the dislocation density in the high dislocation density region and it was less than $1 \times 10^5$ cm$^{-2}$.

Further, the position of the high dislocation density region in plan view was overlapped with the position of the mask layer. Each of the high dislocation density region and the low dislocation density region was formed into a strip shape extending in the direction along the a-axis. The high dislocation density region and the low dislocation density region were alternately formed in the direction along the m-axis.

Further, a dislocation-free region of at least 500 μm square was formed in the low dislocation density region.

From these results, it was confirmed that since the dislocations are locally collected on the upper side of the mask layer during the growth process of the high oxygen concentration layer, the high dislocation density region and the low dislocation density region could be formed following the stripe shape of the mask layer.

(Measurement of Burgers Vector of Dislocation)

As a result of measuring the size of the Burgers vector of the dislocations in the semiconductor layer by the LACBED method using TEM, the size of the Burgers vector of the dislocations was one of a, a+c, and c. From this result, it was confirmed that generation of dislocations having a large Burgers vector could be suppressed in the semiconductor layer.

(2) Experiment 2

(2-1) Fabrication of the Nitride Semiconductor Substrate and the Semiconductor Laminate The semiconductor layer was grown on the base substrate using the method for the above embodiment, in the same manner as in the case of above (1-1) except that a configuration of the base substrate is as follows. Then, the semiconductor layer was sliced to thereby fabricate the nitride semiconductor substrate.

(Base Substrate)
Material: GaN
Fabrication method: VAS method
Diameter: 2 inches
Thickness: 400 μm
Conductivity type of substrate: n type
An n-type impurity in the substrate: Si
N-type impurity concentration in the substrate: $1 \times 10^{18}$ cm$^{-3}$
Low index crystal plane nearest to the main surface: c-face Further, the semiconductor laminate having the following configuration was fabricated using the nitride semiconductor substrate described above.
(Configuration of the Semiconductor Laminate)
Semiconductor functional layer: (from the substrate side) base n-type semiconductor layer, drift layer
Configuration of the base n-type semiconductor layer: Si doped GaN layer
Si concentration in the base n-type semiconductor layer: $2 \times 10^{18}$ cm$^{-3}$
Thickness of the base n-type semiconductor layer: 2 μm
Configuration of the drift layer: Si-doped GaN layer
Si concentration in the drift layer: $0.9 \times 10^{16}$ cm$^{-3}$
Thickness of the drift layer: 13 μm (2-2) Evaluation
(Off-Angle Distribution)

The off-angle distribution in the nitride semiconductor substrate was measured by performing rocking curve measurement of X-ray diffraction in the main surface of the nitride semiconductor substrate.

(Surface Roughness)

Surface roughness of the main surface of the semiconductor functional layer in the semiconductor laminate was measured with an atomic force microscope (AFM).

(2-3) Result
(OFF-Angle Distribution)

FIG. 17 is an off-angle coordinate map showing a relationship between an off-angle distribution of the base substrate, an off-angle distribution of the nitride semiconductor substrate according to the example, and region A, region B, and region C.

As shown in the off-angle coordinate map shown in FIG. 17, it was confirmed that the off-angle distribution of the nitride semiconductor substrate was smaller than the off-angle distribution of the base substrate. It was also confirmed that an entire main surface of the substrate was included in the region B and satisfied the above formulas (2-1) and (2-2). That is, it was confirmed that the proportion of the area of the region (colored region) where the off-angle ($\theta_m$, $\theta_a$) satisfied the formulas (2-1) and (2-2) based on the total area of the main surface of the substrate was about 100% or more.

(Surface Roughness)

It was confirmed that the surface roughness at any position in the main surface of the semiconductor functional layer of the semiconductor laminate was about 7 nm. That is, it was confirmed that the surface morphology of the semiconductor functional layer is good over an entire surface of the substrate.

<Preferable Aspects of the Present Invention>

Preferable aspects of the present invention will be supplementarily described hereafter.

(Supplementary Description 1)

A nitride semiconductor substrate containing a group III nitride semiconductor crystal and having a main surface in which a nearest low index crystal plane is (0001) plane, wherein the (0001) plane in one of a direction along <1-100> axis and a direction along <11-20> axis orthogonal to the <1-100> axis, is curved in a concave spherical shape with respect to the main surface, and a radius of curvature of the (0001) plane in one of the direction along the <1-100> axis and the direction along the <11-20> axis orthogonal to the <1-100> axis is different from a radius of curvature of at least a part of the (0001) plane in the other direction.

(Supplementary Description 2)

The nitride semiconductor substrate according to supplementary description 1, wherein the (0001) plane in the other one of the direction along the <1-100> axis and the direction along the <11-20> axis has convex portions and concave portions alternately arranged in the other direction.

(Supplementary Description 3)

The nitride semiconductor substrate according to supplementary description 1 or 2, wherein the (0001) plane in the direction along the <11-20> axis is curved in a concave spherical shape with respect to the main surface, and a radius of curvature of at least a part of the (0001) plane in the direction along the <1-100> axis is larger than a radius of curvature of the (0001) plane in the direction along the <11-20> axis.

(Supplementary Description 4)

The nitride semiconductor substrate according to the supplementary description 3, wherein the radius of curvature of at least a part of the (0001) plane in the direction along the <1-100> axis is 1.5 times or more the radius of curvature of the (0001) plane in the direction along the <11-20> axis.

(Supplementary Description 5)

The nitride semiconductor substrate according to the supplementary description 1 or 2, wherein the (0001) plane in the direction along the <1-100> axis is curved in a concave spherical shape with respect to the main surface, and a radius of curvature of at least a part of the (0001) plane in the direction along the <11-20> axis is larger than a radius of curvature of the (0001) plane in the direction along the <1-100> axis.

(Supplementary Description 6)

The nitride semiconductor substrate according to the supplementary description 5, wherein the radius of curvature of at least a part of the (0001) plane in the direction along the <11-20> axis is 1.5 times or more the radius of curvature of the (0001) plane in the direction along the <1-100> axis.

(Supplementary Description 7)

The nitride semiconductor substrate according to any one of the supplementary descriptions 1 to 6, wherein the main surface does not include a region where a size of the off-angle of the <0001> axis of the crystal with respect to a normal of the main surface is 0.

(Supplementary Description 8)

The nitride semiconductor substrate according to any one of the supplementary descriptions 1 to 7, wherein when a direction component along the <1-100> axis in an off-angle of the <0001> axis of the crystal with respect to the normal of the main surface is defined as $\theta_m$, and a direction component along the <11-20> axis orthogonal to the <1-100> axis in the off-angle is defined as $\theta_a$, the off angle ($\theta_m$, $\theta_a$) of at least a part of the main surface satisfies the following formula (1):

$$0.0784 \leq \theta_m^2 + \theta_a^2 \leq 0.578 \qquad (1)$$

(Supplementary Description 9)

The nitride semiconductor substrate according to the supplementary description 8, wherein the off angle ($\theta_m$, $\theta_a$) at least at the center of the main surface satisfies the formula (1).

(Supplementary Description 10)

The nitride semiconductor substrate according to the supplementary description 8 or 9, wherein a proportion of an area of a region where the off-angle ($\theta_m$, $\theta_a$) satisfies the formula (1) based on a total area of the main surface is more than 50%.

(Supplementary Description 11)

The nitride semiconductor substrate according to any one of the supplementary descriptions 1 to 7, wherein when a direction component along the <1-100> axis in an off-angle of the <0001> axis of the crystal with respect to the normal of the main surface is defined as $\theta_m$, and a direction component along the <11-20> axis orthogonal to the <1-100> axis in the off-angle is defined as $\theta_a$, the off angle ($\theta_m$, $\theta_a$) of at least a part of the main surface satisfies the following formulas (2-1) and (2-2):

$$0.47 \leq \theta_m \leq 0.71 \qquad (2-1)$$

$$-0.20 \leq \theta_a \leq 0.26 \qquad (2-2)$$

(Supplementary Description 12)

The nitride semiconductor substrate according to the supplementary description 11, wherein the off-angle ($\theta_m$, $\theta_a$) at least at the center of the main surface satisfies the formula (2-1) and the formula (2-2).

(Supplementary Description 13)

The nitride semiconductor substrate according to the supplementary description 11 or 12, wherein the proportion of an area of a region where the off angle ($\theta_m$, $\theta_a$) satisfies the formulas (2-1) and (2-2) based on a total area of the main surface is more than 50%.

(Supplementary Description 14)

The nitride semiconductor substrate according to any one of the supplementary descriptions 1 to 7, wherein when a direction component along the <1-100> axis in an off-angle of the <0001> axis of the crystal with respect to the normal of the main surface is defined as $\theta_m$, and a direction component along the <11-20> axis orthogonal to the <1-100> axis in the off-angle is defined as $\theta_a$, the off angle ($\theta_m$, $\theta_a$) of at least a part of the main surface satisfies the following formulas (3-1) and (3-2):

$$-0.05 \leq \theta_m \leq 0.21 \qquad (3-1)$$

$$0.36 < \theta_a \, 0.65 \qquad (3-2)$$

(Supplementary Description 15)

The nitride semiconductor substrate according to the supplementary description 14, wherein the off angle ($\theta_m$, $\theta_a$) at least at the center of the main surface satisfies the formula (3-1) and the formula (3-2).

(Supplementary Description 16)

The nitride semiconductor substrate according to the supplementary description 14 or 15, wherein a proportion of an area of a region where the off angle ($\theta_m$, $\theta_a$) satisfies the formulas (3-1) and (3-2) based on a total area of the main surface is more than 50%.

(Supplementary Description 17)

The nitride semiconductor substrate according to any one of the supplementary descriptions 1 to 16, wherein a radius of curvature of the (0001) plane is 10 m or more.

(Supplementary Description 18)

The nitride semiconductor substrate according to any one of the supplementary descriptions 1 to 17, wherein when a diameter of the nitride semiconductor substrate is D (mm), in the main surface, a maximum minimum difference in off-angles of the <0001> axis of the crystal with respect to the normal of the main surface is within D/500°.

(Supplementary Description 19)

The nitride semiconductor substrate according to any one of the supplementary descriptions 1 to 18, wherein when there are a plurality of dislocations extending in a direction along the <0001> axis, and when a lattice constant in the <11-20> axial direction is defined as a and a lattice constant in the <0001> axis is defined as c, a size of Burgers vector of each of the plurality of dislocations is any one of a, a+c, and c.

(Supplementary Description 20)

The nitride semiconductor substrate according to any one of the supplementary descriptions 1 to 19, wherein a dislocation density in the main surface is less than $1 \times 10^6$ cm$^{-2}$.

(Supplementary Description 21)

The nitride semiconductor substrate according to any one of the supplementary descriptions 1 to 20, wherein there are a high dislocation density region and a low dislocation density region in the main surface, and a dislocation density in the low dislocation density region is less than $1 \times 10^5$ cm$^{-2}$.

(Supplementary Description 22)

The nitride semiconductor substrate according to any one of the supplementary descriptions 1 to 20, wherein the low dislocation density region includes a dislocation-free region of 50 μm square or more.

(Supplementary Description 23)

A semiconductor laminate having:

a nitride semiconductor substrate containing a group III nitride semiconductor crystal and having a main surface in which a nearest low index crystal plane is (0001) plane; and a semiconductor functional layer provided on the nitride semiconductor substrate and containing a group III nitride semiconductor, wherein in the nitride semiconductor substrate, the (0001) plane in one of a direction along <1-100> axis and a direction along <11-20> axis orthogonal to the <1-100> axis is curved in a concave spherical shape with respect to the main surface, and a radius of curvature of the (0001) plane in one of the direction along the <1-100> axis and the direction along the <11-20> axis orthogonal to the <1-100> axis is different from a radius of curvature of at least a part of the (0001) plane in the other direction.

(Supplementary Description 24)

The semiconductor laminate according to the supplementary description 23, wherein when a direction component along <1-100> axis in an off-angle of <0001> axis of the crystal with respect to a normal of the main surface of the nitride semiconductor substrate is defined as $\theta_m$, and a direction component along <11-20> axis orthogonal to the <1-100> axis in the off-angle is defined as $\theta_a$, a proportion of an area of a region where the off-angle ($\theta_m$, $\theta_a$) satisfies the formula (2-1) and the formula (2-2) based on a total area of the main surface of the nitride semiconductor substrate is more than 50%, and a proportion of an area of a region where an arithmetic average roughness Ra of the main surface of the semiconductor functional layer is 30 nm or less based on a total area of the main surface of the semiconductor functional layer, is more than 50%.

$$0.47 \leq \theta_m \leq 0.71 \quad (2\text{-}1)$$

$$-0.20 \leq \theta_a \leq 0.26 \quad (2\text{-}2)$$

(Supplementary Description 25)

The semiconductor laminate according to the supplementary description 23, wherein when a direction component along <1-100> axis in an off-angle of <0001> axis of the crystal with respect to a normal of the main surface of the nitride semiconductor substrate is defined as $\theta_m$, and a direction component along <11-20> axis orthogonal to the <1-100> axis in the off-angle is defined as $\theta_a$, a proportion of an area of a region where the off-angle ($\theta_m$, $\theta_a$) satisfies the formula (3-1) and the formula (3-2) based on a total area of the main surface of the nitride semiconductor substrate is more than 50%, and a proportion of an area of a region where an arithmetic average roughness Ra of the main surface of the semiconductor functional layer is 30 nm or less based on a total area of the main surface of the semiconductor functional layer, is more than 50%.

$$-0.05 \leq \theta m \leq 0.21 \quad (3\text{-}1)$$

$$0.36 \leq \theta a \leq 0.65 \quad (3\text{-}2)$$

(Supplementary Description 26)

A laminate structure, having:

a base substrate containing a group III nitride semiconductor, in which a low index crystal plane nearest to a main surface is (0001) plane curved in a concave spherical shape with respect to the main surface;

a mask layer provided on the base substrate and having a predetermined opening; and a semiconductor layer containing the group III nitride semiconductor and provided on the base substrate through the opening of the mask layer, wherein a radius of curvature of the (0001) plane of the semiconductor layer is larger than a radius of curvature of the (0001) plane of the base substrate.

(Supplementary Description 27)

A method for manufacturing a nitride semiconductor substrate, including:

preparing a base substrate containing a group III nitride semiconductor, in which a low index crystal plane nearest to a main surface is (0001) plane curved in a concave spherical shape with respect to the main surface;

forming a mask layer having a predetermined opening on the base substrate;

growing a semiconductor layer containing a group III nitride semiconductor on the base substrate through the opening of the mask layer; and slicing the semiconductor layer, and fabricating a nitride semiconductor substrate, wherein in growing the semiconductor layer, a radius of curvature of the (0001) plane in the semiconductor layer is larger than a radius of curvature of the (0001) plane in the base substrate.

(Supplementary Description 28)

The method for manufacturing a nitride semiconductor substrate according to the supplementary description 27, wherein in forming the mask layer, the opening of the mask layer is formed into a stripe shape extending along one of a direction along <1-100> axis and a direction along <11-20> axis orthogonal to the <1-100> axis, and in growing the semiconductor layer, a radius of curvature of the (0001) plane in one of the direction along the <1-100> axis and the direction along the <11-20> axis orthogonal to the <1-100> axis is different from a radius of curvature of at least a part of the (0001) plane in the other direction in the semiconductor layer.

(Supplementary Description 29)

The method for manufacturing a nitride semiconductor substrate according to the supplementary description 28, wherein in growing the semiconductor layer, on the (0001) plane of the semiconductor layer in the other one of the direction along the <1-100> axis and the direction along the <11-20> axis, convex portions and concave portions are formed, which are alternately arranged in the other direction.

(Supplementary Description 30)

The method for manufacturing a nitride semiconductor substrate according to the supplementary description 28 or 29, wherein in forming the mask layer, the opening of the mask layer is formed into a stripe shape extending in the direction along the <11-20> axis, and in growing the semiconductor layer, a radius of curvature of at least a part of the (0001) plane in the direction along the <1-100> axis is larger than a radius of curvature of the (0001) plane in the direction along the <11-20> axis in the semiconductor layer.

(Supplementary Description 31)

The method for manufacturing a nitride semiconductor substrate according to the supplementary description 28 or 29, wherein in forming the mask layer, the opening of the mask layer is formed into a stripe shape extending in the direction along the <1-100> axis, and in growing the semiconductor layer, a radius of curvature of at least a part of the (0001) plane in the direction along the <11-20> axis is larger than a radius of curvature of the (0001) plane in the direction along the <1-100> axis in the semiconductor layer.

(Supplementary Description 32)

The method for manufacturing a nitride semiconductor substrate according to any one of the supplementary descriptions 27 to 31, wherein growing the semiconductor layer includes:

a three-dimensional growth step of three-dimensionally growing the semiconductor layer on the base substrate exposed in the opening of the mask layer, and exposing a facet other than the (0001) plane;

a c-face enlarging step of growing the semiconductor layer while enlarging the (0001) plane, and making the facet other than the (0001) plane disappear; and a c-face growth step of growing the semiconductor layer in a normal direction of the main surface of the base substrate, with the (0001) plane as a growth surface, wherein in the three-dimensional growth step and the c-face enlarging step, oxygen is incorporated into a portion where the semiconductor layer is grown with the facet other than the (0001) plane as a growth surface, and a high oxygen concentration layer having a higher oxygen concentration than other portions is formed in the semi conductor layer.

(Supplementary Description 33)

The method for manufacturing a nitride semiconductor substrate according to the supplementary description 32, wherein in the three-dimensional growth step, the (0001) plane is gradually narrowed toward an upper side of the main surface of the base substrate, and is finally made disappear, and in the c-face enlarging step, the high oxygen concentration layer is formed continuously in the direction along the main surface of the base substrate in the semiconductor layer.

(Supplementary Description 34)

The method for manufacturing a nitride semiconductor substrate according to the supplementary description 32 or 33, wherein at least in the three-dimensional growth step, an inclination angle of the facet other than the (0001) plane with respect to the main surface of the base substrate is gradually decreased toward an upper side of the main surface of the base substrate.

(Supplementary Description 35)

The method for manufacturing a nitride semiconductor substrate according to any one of the supplementary descriptions 32 to 34, wherein in the three-dimensional growth step, the c-face enlarging step, and the c-face growth step, a predetermined growth temperature is maintained.

(Supplementary Description 36)

A method for manufacturing a semiconductor laminate, including:

preparing a base substrate containing a group III nitride semiconductor, in which a low index crystal plane nearest to a main surface is (0001) plane curved in a concave spherical shape with respect to the main surface;

forming a mask layer having a predetermined opening on the base substrate;

growing a semiconductor layer containing a group III nitride semiconductor on the base substrate through the opening of the mask layer;

slicing the semiconductor layer, and fabricating a nitride semiconductor substrate; and epitaxially growing a semiconductor functional layer containing a group III nitride semiconductor on the nitride semiconductor substrate, and fabricating a semiconductor laminate, wherein in growing the semiconductor layer, a radius of curvature of the (0001) plane in the semiconductor layer is larger than a radius of curvature of the (0001) plane in the base substrate.

(Supplementary Description 37)

A method for manufacturing a semiconductor laminate, including:

preparing a base substrate containing a group III nitride semiconductor, in which a low index crystal plane nearest to a main surface is (0001) plane curved in a concave spherical shape with respect to the main surface;

forming a mask layer having a predetermined opening on the base substrate;

growing a semiconductor layer containing a group III nitride semiconductor on the base substrate through the opening of the mask layer, and fabricating a laminate structure; and epitaxially growing a semiconductor functional layer containing a group III nitride semiconductor on the laminate structure, and fabricating a semiconductor laminate, wherein in growing the semiconductor layer, a radius of curvature of the (0001) plane in the semiconductor layer is larger than a radius of curvature of the (0001) plane in the base substrate.

DESCRIPTION OF SIGNS AND NUMERALS

10 Nitride semiconductor substrate (substrate)
10*c* c-axis 10f c-face
10s Main surface
30 Semiconductor laminate
40 Semiconductor device
50 Semiconductor functional layer

What is claimed is:

1. A nitride semiconductor substrate containing a group III nitride semiconductor crystal and having a main surface in which a nearest low index crystal plane is (0001) plane,
wherein the (0001) plane in one of a direction along <1-100> axis and a direction along <11-20> axis orthogonal to the <1-100> axis, is curved in a concave spherical shape with respect to the main surface, and
a radius of curvature of the (0001) plane in one of the direction along the <1-100> axis and the direction along the <11-20> axis orthogonal to the <1-100> axis is different from a radius of curvature of at least a part of the (0001) plane in the other direction.

2. The nitride semiconductor substrate according to claim 1, wherein the (0001) plane in the other one of the direction along the <1-100> axis and the direction along the <11-20> axis has convex portions and concave portions alternately arranged in the other direction.

3. The nitride semiconductor substrate according to claim 1, wherein the (0001) plane in the direction along the <11-20> axis is curved in a concave spherical shape with respect to the main surface, and
a radius of curvature of at least a part of the (0001) plane in the direction along the <1-100> axis is larger than a radius of curvature of the (0001) plane in the direction along the <11-20> axis.

4. The nitride semiconductor substrate according to claim 3, wherein the radius of curvature of at least a part of the (0001) plane in the direction along the <1-100> axis is 1.5 times or more the radius of curvature of the (0001) plane in the direction along the <11-20> axis.

5. The nitride semiconductor substrate according to claim 1, wherein the (0001) plane in the direction along the <1-100> axis is curved in a concave spherical shape with respect to the main surface, and
a radius of curvature of at least a part of the (0001) plane in the direction along the <11-20> axis is larger than a radius of curvature of the (0001) plane in the direction along the <1-100> axis.

6. The nitride semiconductor substrate according to claim 5, wherein the radius of curvature of at least a part of the (0001) plane in the direction along the <11-20> axis is 1.5 times or more the radius of curvature of the (0001) plane in the direction along the <1-100> axis.

7. The nitride semiconductor substrate according to claim 1, wherein the radius of curvature of the (0001) plane is 10 m or more.

8. The nitride semiconductor substrate according to claim 1, wherein when a diameter of the nitride semiconductor substrate is D (mm), in the main surface, a maximum minimum difference in off-angles of the <0001> axis of the crystal with respect to a normal of the main surface is within D/500°.

9. The nitride semiconductor substrate according to claim 1, wherein when there are a plurality of dislocations extending in a direction along the <0001> axis, and when a lattice constant in the <11-20> axial direction is defined as a and a lattice constant of the <0001> axis is defined as c, a size of Burgers vector of each of the plurality of dislocations is any one of a, a+c, and c.

* * * * *

UNITED STATES PATENT AND TRADEMARK OFFICE
CERTIFICATE OF CORRECTION

PATENT NO. : 10,978,296 B2
APPLICATION NO. : 16/223924
DATED : April 13, 2021
INVENTOR(S) : Takehiro Yoshida et al.

It is certified that error appears in the above-identified patent and that said Letters Patent is hereby corrected as shown below:

In the Specification

Column 6, Line 43, "difference AO (of a size)" should read -- difference $\Delta\theta$ (of a size) --

Column 13, Line 52, "and 0.5 respectively." should be -- and 0.5 µm, respectively. --

Column 20, Line 8, "layer continuously in" should read -- layer 98 continuously in --

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*